United States Patent
Takizawa et al.

(10) Patent No.: US 9,324,355 B2
(45) Date of Patent: Apr. 26, 2016

(54) PATTERN FORMATION METHOD, STAMPER MANUFACTURING METHOD, AND MAGNETIC RECORDING MEDIUM MANUFACTURING METHOD

(71) Applicant: KABUSHIKI KAISHA TOSHIBA, Minato-ku (JP)

(72) Inventors: Kazutaka Takizawa, Kawasaki (JP); Takeshi Iwasaki, Inagi (JP); Akihiko Takeo, Kokubunji (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 51 days.

(21) Appl. No.: 14/206,271

(22) Filed: Mar. 12, 2014

(65) Prior Publication Data
US 2015/0179205 A1    Jun. 25, 2015

(30) Foreign Application Priority Data
Dec. 24, 2013 (JP) .................................. 2013-265759

(51) Int. Cl.
| | |
|---|---|
| B44C 1/22 | (2006.01) |
| C03C 15/00 | (2006.01) |
| C03C 25/68 | (2006.01) |
| C23F 1/00 | (2006.01) |
| G11B 5/84 | (2006.01) |
| C25D 1/10 | (2006.01) |
| H01L 21/3065 | (2006.01) |
| H01L 21/263 | (2006.01) |
| H01L 21/311 | (2006.01) |
| G03F 1/00 | (2012.01) |
| G03F 7/00 | (2006.01) |
| G11B 5/855 | (2006.01) |

(52) U.S. Cl.
CPC ................ *G11B 5/8408* (2013.01); *C25D 1/10* (2013.01); *G03F 1/00* (2013.01); *G03F 7/00* (2013.01); *G11B 5/855* (2013.01); *H01L 21/263* (2013.01); *H01L 21/2633* (2013.01); *H01L 21/3065* (2013.01); *H01L 21/311* (2013.01); *H01L 21/31116* (2013.01)

(58) Field of Classification Search
None
See application file for complete search history.

(56) References Cited

U.S. PATENT DOCUMENTS

| | | | | |
|---|---|---|---|---|
| 2005/0266271 | A1* | 12/2005 | Tsuchiya et al. | 428/810 |
| 2006/0269796 | A1* | 11/2006 | Hyodo | 428/833.2 |
| 2007/0065683 | A1* | 3/2007 | Sonoda et al. | 428/833.2 |
| 2007/0212806 | A1 | 9/2007 | Ito | |
| 2008/0241595 | A1* | 10/2008 | Kimura et al. | 428/800 |

(Continued)

FOREIGN PATENT DOCUMENTS

| | | |
|---|---|---|
| JP | 2007-240981 | 9/2007 |
| JP | 2008-270689 | 11/2008 |

(Continued)

*Primary Examiner* — Stephanie Duclair
(74) *Attorney, Agent, or Firm* — Oblon, McClelland, Maier & Neustadt, L.L.P.

(57) ABSTRACT

According to one embodiment, a pattern formation method includes steps of forming a layer to be processed on a substrate, forming a metal microparticle layer by coating the layer to be processed with a metal microparticle coating solution containing metal microparticles and a solvent, reducing a protective group amount around the metal microparticles by first etching, forming a protective layer by exposing the substrate to a gas containing C and F and adsorbing the gas around the metal microparticles to obtain a projection pattern, and transferring the projection pattern to the layer to be processed by second etching.

9 Claims, 12 Drawing Sheets

(56) References Cited

U.S. PATENT DOCUMENTS

| | | | |
|---|---|---|---|
| 2009/0114944 A1* | 5/2009 | Ono et al. | 257/103 |
| 2009/0127095 A1 | 5/2009 | Iwata et al. | |
| 2009/0127224 A1 | 5/2009 | Takeuchi et al. | |
| 2009/0244776 A1* | 10/2009 | Kubota et al. | 360/135 |
| 2011/0260196 A1 | 10/2011 | Okagawa et al. | |
| 2012/0228654 A1* | 9/2012 | Fujimoto et al. | 257/98 |
| 2013/0078813 A1 | 3/2013 | Chiba et al. | |

FOREIGN PATENT DOCUMENTS

| | | |
|---|---|---|
| JP | 2008-305473 | 12/2008 |
| JP | 2009-129492 | 6/2009 |

\* cited by examiner

PATTERN FORMATION METHOD, STAMPER MANUFACTURING METHOD, AND MAGNETIC RECORDING MEDIUM MANUFACTURING METHOD

CROSS-REFERENCE TO RELATED APPLICATIONS

This application is based upon and claims the benefit of priority from Japanese Patent Application No. 2013-265759, filed Dec. 24, 2013, the entire contents of which are incorporated herein by reference.

FIELD

Embodiments described herein relate generally to a pattern formation method, stamper manufacturing method, and magnetic recording medium manufacturing method.

BACKGROUND

Recently, as the amount of information significantly increases, strong demands have arisen for implementing a large-capacity information recording device. Element sizes of semiconductor memory devices are being extensively decreased in order to increase the capacity by increasing the packing density per unit area. For example, transistor wiring dimensions are being decreased within the range of a few nm to a few ten nm, so demands have arisen for implementing manufacturing techniques meeting this demand. Also, as hard disk drive (HDD) techniques, the development of various techniques such as perpendicular magnetic recording has been advanced to increase the density of a recording medium. In addition, a patterned medium has been proposed as a medium capable of further increasing the recording density and achieving a thermal fluctuation resistance of medium magnetization at the same time.

The patterned medium records one or a plurality of magnetic regions as one cell. To record one-bit information in one cell, individual recording cells must magnetically be isolated. Therefore, a general approach is to, e.g., isolate magnetic dot portions and nonmagnetic portions in the same plane by using the micropatterning techniques in the semiconductor manufacturing field. The patterned medium manufacturing methods include a top-down method and bottom-up method to be described below. The top-down method is a method of transferring a projection micropattern to a lower magnetic recording layer by using a projection pattern mask formed on the magnetic recording layer. On the other hand, the bottom-up method is a method in which a micropattern is formed on a substrate beforehand, a magnetic recording layer is deposited on the projection micropattern, and the recording layer material is traced into a projection shape, thereby obtaining an isolated pattern. Also, as a special method, a projection micropattern is formed on a magnetic recording layer, a nonmagnetic region is formed by irradiating the mask with high-energy ions and implanting the ions into a desired region, thereby selectively isolating the magnetic recording pattern.

As described above, in order to increase the recording density, it is necessary to form the above-mentioned micropattern on a substrate, and form a mask capable of corresponding to the pitch reduction of the projection pattern. Examples of the existing techniques meeting this demand are various lithography techniques using ultraviolet exposure or electron beam exposure. On the other hand, micropatterning using metal microparticles is available as a method capable of simply forming micropatterns with smaller dimensional variations.

A metal microparticle is a general term for microparticles having a diameter of a few nm to a few hundred nm, and is also called a nanoparticle or simply called a microparticle. When using metal microparticles on a substrate, the substrate is normally coated with a so-called dispersion in which the metal microparticle material is dispersed in a specific solvent, thereby obtaining a periodic pattern of the metal microparticles. Then, an independent projection pattern can be obtained on the same plane by using the metal microparticle coating film as a mask layer or underlayer. It is also possible to form a physical projection pattern on a substrate in advance, and artificially arrange a desired pattern by using the projection pattern as a guide.

Although metal microparticles are formed by various materials, microparticles using a noble-metal material are particularly chemically stable and have a high etching resistance. When using these microparticles as a projection pattern processing mask, it is possible to maintain the processing margin and reduce a dimensional conversion difference in the processed pattern. However, it is also possible to apply microparticles based on other oxide materials or compound materials.

Metal microparticles existing in a free space and dispersion tend to aggregate by receiving interactions from surrounding metal microparticles due to the Van der Waals force. To prevent this aggregation of the metal microparticles, therefore, a general designing/manufacturing guideline is to give a protective group having a polymer chain to the surface of each microparticle, thereby physicochemically isolating the microparticle from adjacent metal microparticles. In a micropatterning process using metal microparticles as masks, however, the protective group around each metal microparticle disappears due to plasma damage, so adjacent metal microparticles aggregate. Accordingly, a mask pattern changes on a substrate, and the dimensional variation of a transferred projection pattern worsens. The aggregation of the metal microparticles not only decreases the accuracy of the transferred pattern, but also behaves as a residue on the substrate. Therefore, unnecessary particles decrease the yield in a semiconductor manufacturing step, and particles forming a projection pattern deteriorate the head floating characteristic of a hard disk medium, and this worsens the HDI (Head Disk Interface) characteristic. Accordingly, suppressing the aggregation of microparticles is an important item in managing the yield of manufacturing steps. Also, as the dimensions of micropatterns are decreased, micropatterning is also required for mask materials, and this makes it necessary to transfer a projection pattern of narrow-pitch metal microparticles. On the other hand, as described previously, increasing the distance between microparticles in order to suppress the aggregation of the particles increases the inter-microparticle distance, i.e., the pattern pitch. Therefore, a method of suppressing aggregation without much increasing the inter-microparticle distance is necessary.

Furthermore, giving the protective group to the metal microparticle prolongs the manufacturing tact time and increases the cost. Accordingly, the protective group for suppressing the aggregation of the metal microparticles is desirably a material that does not much increase the inter-microparticle distance. In addition, the manufacturing method is desirably less expensive. However, a general conventional method is to give a polymer protective group when synthesizing metal microparticles, and this makes it difficult to meet the above-mentioned requirements at the same time as described above.

In a micropattern formation process using metal microparticles, therefore, it is desirable to secure narrow spacings, maintain the pattern arrangement accuracy, and increase the processing margin, in addition to suppressing the aggregation of the metal microparticles, so a manufacturing method capable of meeting all these requirements must be implemented. However, when forming a metal microparticle mask or projection micropattern by applying the conventional techniques, the above-described, trade-off problem arises, and this makes it extremely difficult to obtain a high-resolution projection pattern.

DETAILED DESCRIPTION

Figure 1A:
FIGS. 1A, 1B, 1C, 1D, 1E, and 1F are views showing an example of a pattern formation method according to the first embodiment.

A pattern formation method according to the first embodiment includes step of
 forming a layer to be processed on a substrate,
 forming a metal microparticle layer by coating the layer to be processed with a metal microparticle coating solution containing metal microparticles and a solvent,
 reducing a protective group amount around the metal microparticles by first etching,
 forming a protective layer by exposing the substrate to a gas containing carbon and fluorine, and adsorbing the gas around the metal microparticles to obtain a projection pattern, and
 transferring the projection pattern to the layer to be processed by second etching.

A pattern formation method according to the second embodiment is same as that of the first embodiment except that the method further includes a step of removing the metal microparticles after the step of transferring the projection pattern to the layer to be processed.

A stamper manufacturing method according to the third embodiment includes steps of
 forming a layer to be processed on a substrate,
 forming a metal microparticle layer by coating the layer to be processed with a metal microparticle coating solution containing metal microparticles and a solvent,
 reducing a protective group amount around the metal microparticles by first etching,
 forming a protective layer by exposing the substrate to a gas containing carbon and fluorine, and adsorbing the gas around the metal microparticles,
 transferring a projection pattern to the layer to be processed by second etching,
 forming a conductive layer on the projection pattern,
 forming an electroformed layer by performing electroplating on the conductive layer, and
 releasing the electroformed layer from the layer to be processed.

A stamper manufacturing method according to the third embodiment further can include a step of removing the metal microparticles before the step of forming the conductive layer on the projection pattern.

A magnetic recording medium manufacturing method according to the fourth embodiment includes steps of
 forming a magnetic recording layer on a substrate,
 forming a metal microparticle layer by coating the magnetic recording layer with a metal microparticle coating solution containing metal microparticles and a solvent,
 reducing a protective group amount around the metal microparticles by first etching,
 forming a protective layer by exposing the substrate to a gas containing carbon and fluorine, and adsorbing the gas around the metal microparticles, and
 transferring a projection pattern to the magnetic recording layer by second etching.

A magnetic recording medium manufacturing method according to the fifth embodiment further includes a step of forming a release layer on the magnetic recording layer before the step of forming the metal microparticle layer, and a step of dissolving away the release layer and removing the metal microparticle layer after the step of transferring the projection pattern to the magnetic recording layer.

A magnetic recording medium manufacturing method according to the sixth embodiment includes steps of
forming an underlayer on a substrate,
forming a metal microparticle layer by coating the underlayer with a metal microparticle coating solution containing metal microparticles and a solvent,
reducing a protective group amount around the metal microparticles by first etching,
forming a protective layer by exposing the substrate to a gas containing carbon and fluorine, and adsorbing the gas around the metal microparticles,
transferring a projection pattern to the underlayer by second etching,
removing the metal microparticles from the underlayer, and
forming a magnetic recording layer on the underlayer having the projection pattern.

A magnetic recording medium manufacturing method according to the seventh embodiment includes steps of
forming a layer to be processed on a substrate,
forming a metal microparticle layer by coating the layer to be processed with a metal microparticle coating solution containing metal microparticles and a solvent,
reducing a protective group amount around the metal microparticles by first etching,
forming a protective layer by exposing the substrate to a gas containing carbon and fluorine, and adsorbing the gas around the metal microparticles,
transferring a projection pattern to the layer to be processed by second etching,
forming a conductive layer on the projection pattern,
forming an electroformed layer by performing electroplating on the conductive layer,
releasing the electroformed layer from the layer to be processed, thereby forming a stamper,
forming a magnetic recording layer on a substrate,
forming a resist layer on the magnetic recording layer,
forming a projection pattern by imprinting the stamper on the resist layer, and
transferring the projection pattern to the magnetic recording layer.

A magnetic recording medium manufacturing method according to the eighth embodiment includes steps of
forming a layer to be processed on a substrate,
forming a metal microparticle layer by coating the layer to be processed with a metal microparticle coating solution containing metal microparticles and a solvent,
reducing a protective group amount around the metal microparticles by first etching,
forming a protective layer by exposing the substrate to a gas containing carbon and fluorine, and adsorbing the gas around the metal microparticles,
transferring a projection pattern to the layer to be processed by second etching,
forming a conductive layer on the projection pattern,
forming an electroformed layer by performing electroplating on the conductive layer,
releasing the electroformed layer from the layer to be processed, thereby forming a stamper,
forming a magnetic recording layer on a substrate,
forming an underlayer on the magnetic recording layer,
forming a resist layer on the underlayer,
forming a projection pattern by imprinting the stamper on the resist layer,
transferring the projection pattern to the underlayer, and
forming a magnetic recording layer on the underlayer having the projection pattern.

In the first to eighth embodiments described above, the protective group formed around the metal microparticles beforehand and having a weak aggregation suppressing effect is partially removed by etching, thereby reducing the amount of protective group. After that, the microparticle surface is exposed to a gas containing carbon and fluorine, and the gas is adsorbed to the microparticle surface and substituted with the protective group. This makes it possible to more satisfactorily suppress the aggregation of the microparticle layer. When using this gas exposure method, a protective group having an aggregation suppressing effect can be given independently of the protective group material or the type of protective group material which is restricted by the solvent species or the like. In addition, since the manufacturing method is simplified by gas exposure, it is possible to shorten the manufacturing tact time and reduce the cost.

Also, in the method according to the embodiment, materials can be selected from a broad range without being restricted by the protective group material or solvent species when synthesizing metal microparticles. In addition, a manufacturing method capable of simultaneously satisfying all of the suppression of the aggregation of a microparticle mask, the assurance of narrow spacings, the increase in processing margin, and the suppression of the deterioration of the pitch variation is provided, and a microparticle mask can be formed by applying the process.

In the embodiment, it is unnecessary to give the protective group to metal microparticles during synthesis, and this makes it possible to substitute the protective group by simple gas exposure, and reduce aggregation.

The embodiments will be explained below with reference to the accompanying drawings.

FIGS. 1A, 1B, 1C, 1D, 1E, and 1F are views showing an example of the pattern formation method according to the first embodiment.

Figure 1B:
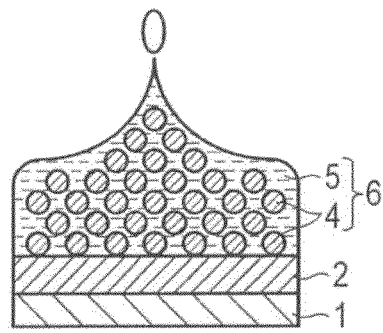
Figure 1C:
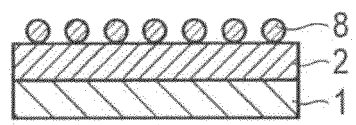
Figure 1D:
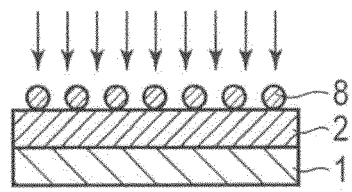
Figure 1E:
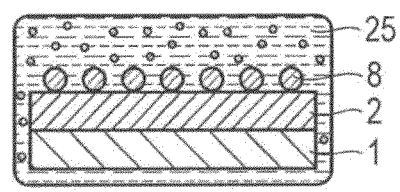
Figure 1F:
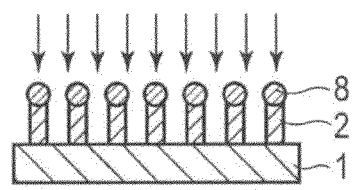

As shown in these drawings, the pattern formation method according to the first embodiment includes
forming a layer 2 to be processed on a substrate 1, as shown in FIG. 1A,
coating the layer 2 to be processed with a dispersion 6 containing metal microparticles 4 and a solvent 5, as shown in FIG. 1B, thereby forming a metal microparticle layer 8, as shown in FIG. 1C,
reducing a protective group amount on the metal microparticle surfaces of the metal microparticle layer 8 by performing first etching, as shown in FIG. 1D,
forming a protective layer (not shown) by exposing the metal microparticle layer 8 to a gas ambient 25 containing carbon and fluorine, as shown in FIG. 1E, and
transferring a projection pattern to the layer 2 to be processed by using the metal microparticle layer 8 as a mask by performing second etching, as shown in FIG. 1F.

FIGS. 2A, 2B, 2C, 2D, 2E, 2F, and 2G are views showing an example of the pattern formation method according to the second embodiment.

Figure 2A:
FIGS. 2A, 2B, 2C, 2D, 2E, 2F, and 2G are views showing an example of a pattern formation method according to the second embodiment.
Figure 2B:
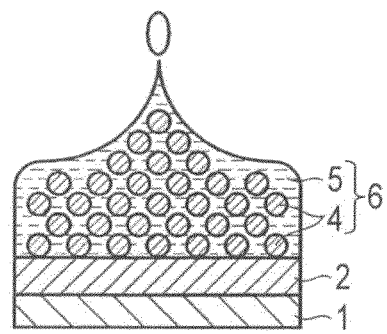
Figure 2C:
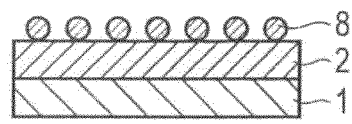
Figure 2D:
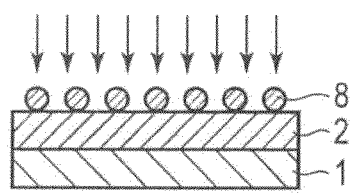
Figure 2E:
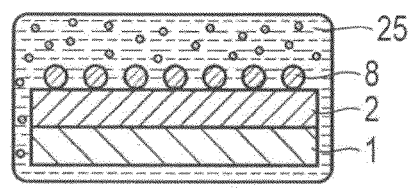
Figure 2F:
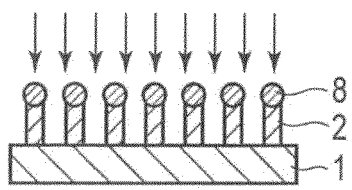
Figure 2G:

The pattern formation method according to the second embodiment is a modification of the pattern formation method according to the first embodiment, and is the same as the pattern formation method according to the first embodiment except that a step of removing microparticles, as shown in FIG. 2G, is further included after a step of transferring a projection pattern to a layer 2 to be processed, as shown in FIG. 2F.

FIGS. 3A, 3B, 3C, 3D, 3E, and 3F are views showing an example of the pattern formation method according to the third embodiment.

Figure 3A:
FIGS. 3A, 3B, 3C, 3D, 3E, and 3F are views showing an example of a stamper manufacturing method according to the third embodiment.
Figure 3B:

The third embodiment is directed to steps of manufacturing a stamper by using the projection pattern formed by the first and second embodiments. A stamper 30 is obtained following the same procedures as in the first and second embodiments except that the third embodiment includes a step of preparing a substrate 1 on which a layer 2 to be processed having a projection pattern is formed, as shown in FIG. 3A, and covering, with a conductive layer 11, the substrate 1 on which the layer 2 to be processed having the projection pattern is formed, as shown in FIG. 3B, a step of forming an electroformed layer 12 on the surface of the conductive layer 11 by performing electroplating on the conductive layer 11, as shown in FIG. 3C, and a step of releasing the electroformed layer 12 from the substrate 1, as shown in FIG. 3F.

Figure 3C:
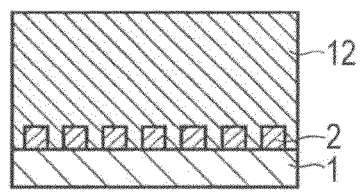
Figure 3D:
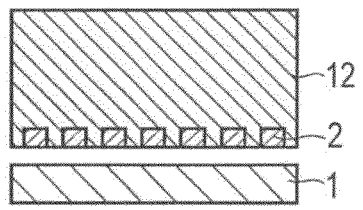
Figure 3E:
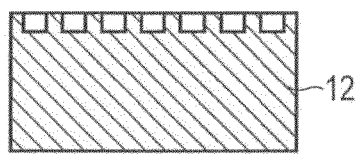
Figure 3F:
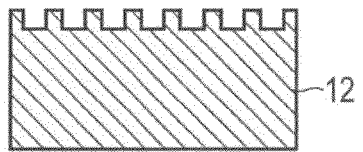

After the step shown in FIG. 3C and the step shown in FIG. 3F, it is also possible to add a step of releasing the electroformed layer 12 including the conductive layer 11 together with the layer 2 to be processed from the substrate 1, as shown in FIG. 3D, and a step of removing the residue of the layer 2 to be processed by etching, as shown in FIG. 3E.

FIGS. 4A, 4B, 4C, 4D, 4E, 4F, and 4G are views showing an example of the magnetic recording medium manufacturing method according to the fourth embodiment.

Figure 4A:
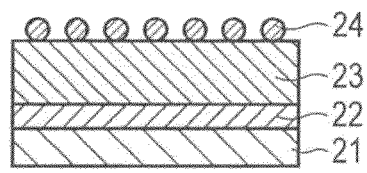
FIGS. 4A, 4B, 4C, 4D, 4E, 4F, and 4G are views showing an example of a magnetic recording medium manufacturing method according to the fourth embodiment.
Figure 4B:
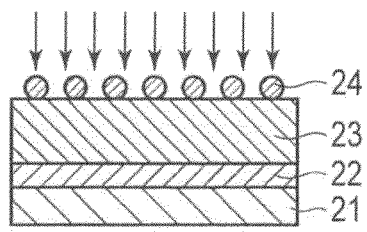
Figure 4C:
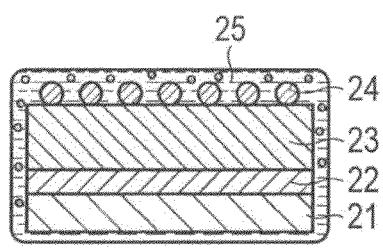
Figure 4D:
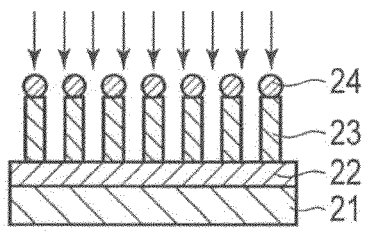
Figure 4E:
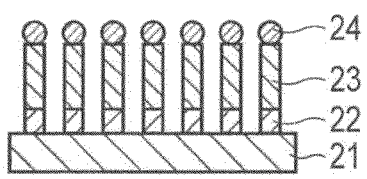
Figure 4F:

The fourth embodiment is directed to a magnetic recording medium manufacturing method, and includes steps of forming a magnetic recording layer 22 on a substrate 21, forming a mask layer 23 on the magnetic recording layer 22, and forming a metal microparticle layer 24 on the mask layer 23, as shown in FIG. 4A, reducing a protective group amount on the metal microparticle surfaces of the metal microparticle layer 24 by performing first etching, as shown in FIG. 4B, forming a protective layer (not shown) by exposing the metal microparticle layer 24 to a gas ambient 25 containing carbon and fluorine, as shown in FIG. 4C, transferring a projection pattern formed by the metal microparticle layer 24 to the mask layer 23, as shown in FIG. 4D, transferring the projection pattern to the magnetic recording layer 22, as shown in FIG. 4E, and removing the mask layer 23 from the magnetic recording layer 22, as shown in FIG. 4F.

Figure 4G:
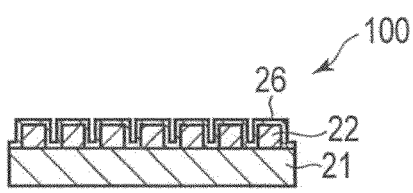

A magnetic recording medium 100 can be obtained by further forming an arbitrary protective layer 26 on the magnetic recording layer 22, as shown in FIG. 4G.

FIGS. 5A, 5B, 5C, 5D, 5E, 5F, 5G, 5H, and 5I are views showing an example of the magnetic recording medium manufacturing method according to the fifth embodiment.

Figure 5A:
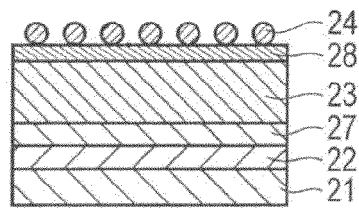
FIGS. 5A, 5B, 5C, 5D, 5E, 5F, 5G, 5H, and 5I are views showing an example of a magnetic recording medium manufacturing method according to the fifth embodiment.
Figure 5E:
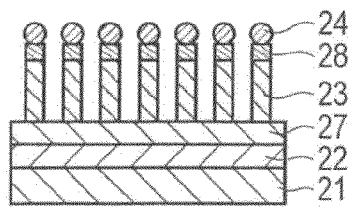
Figure 5B:
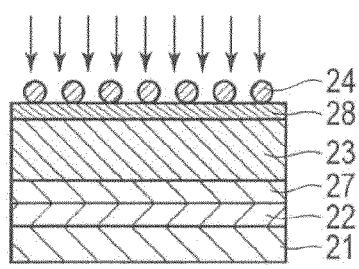
Figure 5F:
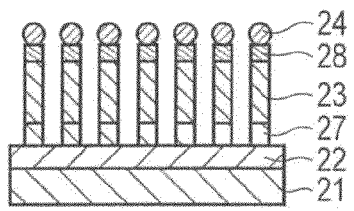
Figure 5C:
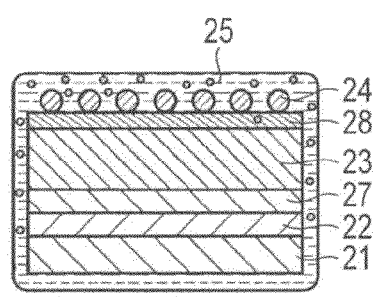
Figure 5G:
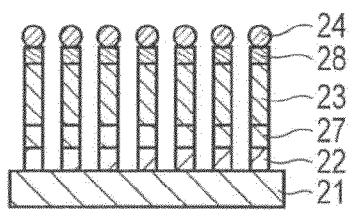
Figure 5H:
Figure 5D:
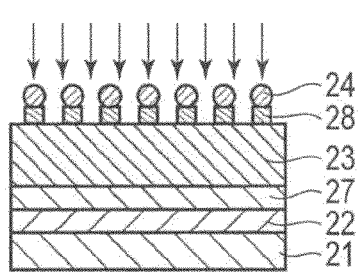
Figure 5I:
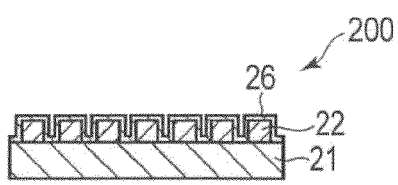

The fifth embodiment is a modification of the fourth embodiment. A magnetic recording medium 200 can be obtained following the same procedures as in the fourth embodiment except that the fifth embodiment includes steps of forming a magnetic recording layer 22, release layer 27, mask layer 23, and metal microparticle layer 24 on a substrate 21, as shown in FIG. 5A, in the same manner as in FIG. 4A except that the release layer 27 is formed between the magnetic recording layer 22 and mask layer 23, and transferring a projection pattern of the mask layer 23 to the release layer 27, as shown in FIG. 5F, transferring the projection pattern of the release layer 27 to the magnetic recording layer 22, as shown in FIG. 5G, and removing the mask layer 23 from the magnetic recording layer 22 by dissolving away the release layer 27, as shown in FIG. 5H, instead of FIGS. 4D, 4E, and 4F.

Also, as shown in FIGS. 5A, 5B, 5C, 5D, 5E, 5F, and 5G, a transfer layer 28 for increasing the pattern transfer accuracy can be formed as needed between the mask layer 23 and metal microparticle layer 24.

FIGS. 6A, 6B, 6C, 6D, 6E, 6F, and 6G are views showing an example of the magnetic recording medium manufacturing method according to the sixth embodiment.

Figure 6A:
FIGS. 6A, 6B, 6C, 6D, 6E, 6F, and 6G are views showing an example of a magnetic recording medium manufacturing method according to the sixth embodiment.
Figure 6B:
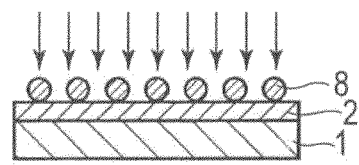
Figure 6C:
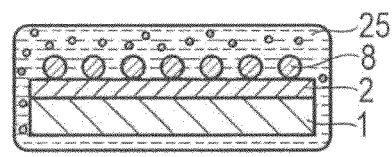
Figure 6D:
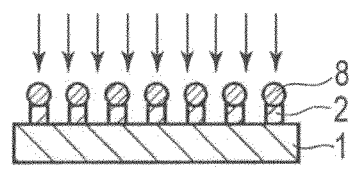
Figure 6E:
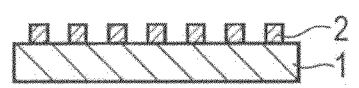
Figure 6F:
Figure 6G:
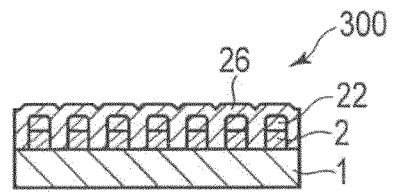

The sixth embodiment is directed to a magnetic recording medium manufacturing method, and is the same as the method shown in FIGS. 2A, 2B, 2C, 2D, 2E, 2F, and 2G except that after a substrate 1 having a layer 2 to be processed having a projection pattern is formed, as shown in FIG. 2G, a magnetic recording layer 22 is formed, as shown in FIG. 6F, and a protective layer 26 is formed on the magnetic recording layer 22, as shown in FIG. 6G. Also, an obtained magnetic recording medium 300 has the same arrangement as that of the magnetic recording media 100 and 200 shown in FIGS. 4G and 5I, except that the layer 2 to be processed having the projection pattern is formed between the substrate 1 and magnetic recording layer 22.

FIGS. 7A, 7B, 7C, 7D, 7E, 7F, 7G, 7H, and 7I show an example of the magnetic recording medium manufacturing method according to the seventh embodiment.

Figure 7A:
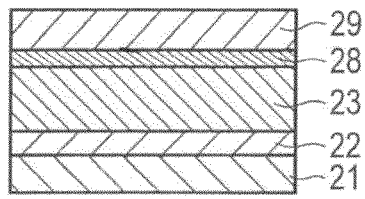
FIGS. 7A, 7B, 7C, 7D, 7E, 7F, 7G, 7H, and 7I are views showing nanoimprinting and an example of a magnetic recording medium manufacturing method according to the seventh embodiment.
Figure 7E:
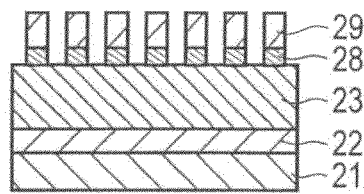
Figure 7B:
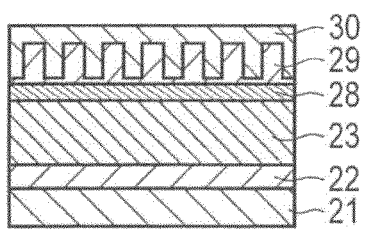
Figure 7F:
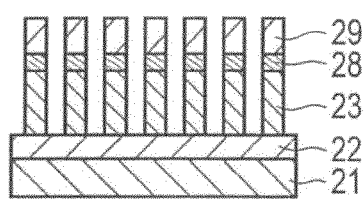
Figure 7C:
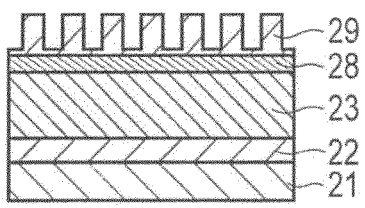
Figure 7G:
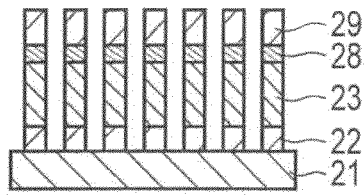
Figure 7H:
Figure 7D:
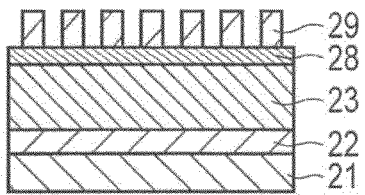
Figure 7I:
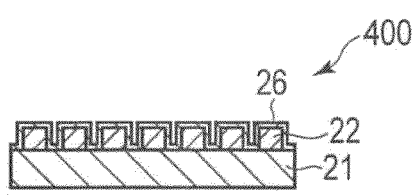

The seventh embodiment is an example in which a magnetic recording medium is manufactured by nanoimprinting by using the stamper manufactured by the third embodiment, and a magnetic recording medium 400 is manufactured by steps of forming a magnetic recording layer 22, mask layer 23, transfer layer 28, and nanoimprinting resist layer 29 on a substrate 21, as shown in FIG. 7A, transferring a projection pattern by pressing a stamper 30 against the nanoimprinting resist layer 29, as shown in FIG. 7B, releasing the stamper 30 from the projection pattern of the nanoimprinting resist layer 29, as shown in FIG. 7C, exposing the surface of the transfer layer 28 by removing the residue of the nanoimprinting resist layer 29 by etching, as shown in FIG. 7D, transferring the projection pattern of the nanoimprinting resist layer 29 to the transfer layer 28, as shown in FIG. 7E, transferring the projection pattern of the transfer layer 28 to the mask layer 23, as shown in FIG. 7F, transferring the projection pattern of the mask layer 23 to the magnetic recording layer 22, as shown in FIG. 7G, obtaining a stack of the substrate 21 and magnetic recording layer 22 by removing the mask layer 23 by etching, as shown in FIG. 7H, and forming a protective layer 26 on the magnetic recording layer 22, as shown in FIG. 7I.

FIGS. 8A, 8B, 8C, 8D, 8E, 8F, 8G, and 8H show an example of the magnetic recording medium manufacturing method according to the eighth embodiment.

Figure 8A:
FIGS. 8A, 8B, 8C, 8D, 8E, 8F, 8G, and 8H are views showing nanoimprinting and an example of a magnetic recording medium manufacturing method according to the eighth embodiment.
Figure 8B:
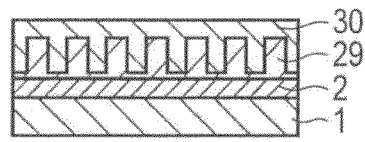
Figure 8C:
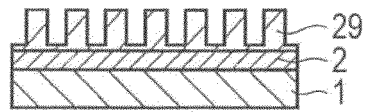
Figure 8D:
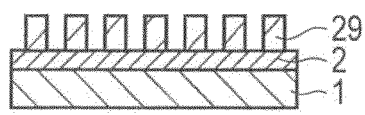
Figure 8E:
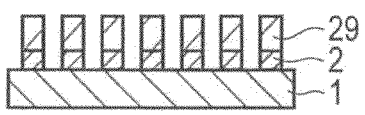
Figure 8F:
Figure 8G:
Figure 8H:
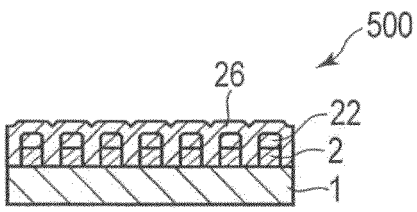

The eighth embodiment is a modification of the example in which a magnetic recording medium is manufactured by nanoimprinting by using the stamper manufactured by the third embodiment, and a magnetic recording medium 500 is manufactured by steps of forming a layer 2 to be processed and nanoimprinting resist layer 29 on a substrate 1, as shown in FIG. 8A, transferring a projection pattern by pressing a stamper 30 against the nanoimprinting resist layer 29, as shown in FIG. 8B, releasing the stamper 30 from the projection pattern of the nanoimprinting resist layer 29, as shown in FIG. 8C, exposing the surface of the layer 2 to be processed by removing the residue of the nanoimprinting resist layer 29 by etching, as shown in FIG. 8D, transferring the projection pattern to the layer 2 to be processed by etching, as shown in FIG. 8E, removing the nanoimprinting resist layer 29 from the layer 2 to be processed, as shown in FIG. 8F, forming a magnetic recording layer 22 on the layer 2 to be processed, as shown in FIG. 8G, and forming a protective layer 26 on the magnetic recording layer 22, as shown in FIG. 8H.

Since the microparticles are covered with the polymer protective group in the stage of material synthesis, the metal microparticle surfaces are exposed by decomposing and removing the protective group by the first etching. In this case, the protective group can be removed within the range in which no metal microparticles aggregate, and the total covering solid component amount of the protective group component can be set to 30% or more with respect to the metal microparticle surfaces. The protective group amount around the microparticles need only be reduced by the first etching, and wet etching or dry etching is applicable.

In addition, when gas exposure is performed on the exposed metal microparticles, the gas component can be adhered as a protective group to the microparticle surfaces. In this case, the gas component is adsorbed to the terminal end of the polymer protective group given to the microparticle surfaces beforehand. When performing gas exposure to the polymer protective group, the coverage to the microparticle surfaces is high, so aggregation can be suppressed more. Therefore, the reduction in coverage caused by side etching when transferring a projection pattern is small, so an etching margin to the aggregation of the microparticles caused by the disappearance of the protective group is wide. This can effectively increase the processing margin of the projection pattern transfer step.

The gas component is desirably a material that is easily adsorbed to the microparticle surfaces, and particularly desirably a material containing at least carbon and fluorine. When the gas component adheres to the protective group around the metal microparticles, the gas component can function as a protective group having a different surface activity. When using a fluorine-based gas and carbon-based gas, it is possible to adjust the two components. In practice, however, a versatile gas such as $CF_4$ or $CHF_3$ is also applicable. The adhesion amount of the carbon- or fluorine-based gas can be adjusted by changing the gas flow rate, gas pressure, and gas species. It is also possible to use a gas such as $CH_3F$, $CH_2F_2$, $C_4F_6$, or $C_4F_8$.

Also, the projection pattern can be transferred to the layer to be processed by the second etching. In this step, the metal microparticles do not aggregate, and the projection pattern can be transferred. Wet etching and dry etching are applicable as this etching, and it is possible to apply dry etching as a method capable of decreasing the dimensional conversion difference produced by side etching because the anisotropy in the depth direction of the pattern is large.

When applying dry etching in the second etching, various active gases can be used, and a gas containing carbon and fluorine can be used as a material that reduces the aggregation of the microparticle layer. Since etching progresses while giving the gas component to the microparticle surfaces in the second etching as well, the projection pattern is transferred without deteriorating the pattern accuracy.

In the first to eighth embodiments, the metal microparticle material is selected from the group consisting of, e.g., C, Pt, Ni, Pd, Co, Al, Ti, Ce, Si, Fe, Au, Ag, Cu, Ta, Zr, Zn, Mo, W, and Ru, and it is also possible to apply an oxide of each element, a nitride of each element, and a compound of two or more elements.

The dispersion medium contained in the dispersion of the metal microparticles is selected from polar and nonpolar solvents, and the concentration of the metal microparticles may also be changed by adding a solvent. That is, the concentration of the metal microparticles can be changed in accordance with the area of a substrate to be coated or the number of metal microparticle layers to be formed.

When giving and substituting the protective group by gas exposure, a polymer shell is formed on the microparticle surface. This shell is formed by adsorption of the polymer terminal end, and has an extremely small thickness, and more specifically, a thickness of 1 nm or less. Accordingly, it is possible to adjust the surface properties and suppress aggregation by hardly changing the inter-metal-microparticle distance.

Layer to be Processed Formation Step

First, a layer to be processed is formed on a substrate. The layer to be processed is a layer to which a metal microparticle projection pattern (to be described later) is transferred. The metal microparticle projection pattern can be transferred directly to the layer to be processed, but a mask layer can be formed between the layer to be processed and a metal microparticle layer in order to improve the transfer accuracy.

Although the shape of the substrate is not limited at all, the substrate is normally circular and made of a hard material. Examples are a glass substrate, metal-containing substrate, carbon substrate, and ceramics substrate. To improve the pattern in-plane uniformity, the projection pattern of the substrate surface is desirably decreased. It is also possible to form a protective film such as an oxide film on the substrate surface as needed.

As the glass substrate, it is possible to use amorphous glass such as soda lime glass or aluminosilicate glass, or crystallized glass such as lithium-based glass. Furthermore, a sintered substrate mainly containing alumina, aluminum nitride, or silicon nitride can be used as the ceramics substrate.

The layer to be processed can be formed on the substrate by various methods. For example, the layer to be processed can be formed by PVD (Physical Vapor Deposition) such as vacuum deposition, electron beam deposition, molecular beam deposition, ion beam deposition, ion plating, and sputtering, and CVD (Chemical Vapor Deposition) using heat, light, and plasma. Also, in these physical and chemical vapor deposition methods, the thickness of the layer to be processed can be adjusted by properly changing parameters such as the process gas pressure, gas flow rate, substrate temperature, input power, chamber ambient, and deposition time.

The layer to be processed is selected from various materials in accordance with the application. More specifically, the layer to be processed is selected from the group consisting of Al, C, Si, Ti, V, Cr, Mn, Co, Ni, Cu, Fe, Zn, Ga, Zr, Nb, Mo, Ru, Pd, Ag, Au, Hf, Ta, W, Ir, and Pt, and can be made of alloys and compounds thereof. An alloy is made of at least two types of materials selected from the above group. Also, a compound is selected from, e.g., an oxide, nitride, boride, and carbide. In this case, it is possible to select the material of a metal microparticle film to be formed on the layer to be processed and a mask layer material capable ensuring an etching selectivity to projection pattern dimensions, and appropriately determine the film thickness.

In an example of the magnetic recording medium manufacturing method, this layer to be processed can be used as a magnetic recording layer. It is possible to obtain a magnetic recording medium having a projection pattern structure physically and magnetically isolated by transferring the projection pattern of the metal microparticle layer to the magnetic recording layer.

The magnetic recording layer is deposited on the substrate as described previously. In addition, a soft under layer (SUL) having a high magnetic permeability can be formed between the substrate and magnetic recording layer. The soft under layer returns a recording magnetic field from a magnetic head for magnetizing the magnetic recording layer, i.e., performs a part of the magnetic head function. The soft under layer can apply a sufficient steep perpendicular magnetic field to the magnetic field recording layer, thereby increasing the recording/reproduction efficiency.

Materials containing, e.g., Fe, Ni, and Co can be used as the soft under layer. Among these materials, it is possible to use an amorphous material having none of magnetocrystalline anisotropy, a crystal defect, and a grain boundary, and showing a high soft magnetism. The soft amorphous material can reduce the noise of the recording medium. An example of the soft amorphous material is a Co alloy mainly containing Co and also containing at least one of Zr, Nb, Hf, Ti, and Ta. For example, it is possible to select CoZr, CoZrNb, and CoZrTa.

In addition, an underlayer for improving the adhesion of the soft under layer can be formed between the soft under layer and substrate. As the underlayer material, it is possible to use at least one material selected from, e.g., Ni, Ti, Ta, W, Cr, Pt, and alloys, oxides, and nitrides of these elements. For example, it is possible to use NiTa and NiCr as the underlayer material. Note that the underlayer can include multiple layers.

Furthermore, an interlayer made of a nonmagnetic metal material can be formed between the soft under layer and magnetic recording layer. The interlayer has two functions: one is to interrupt the exchange coupling interaction between the soft under layer and magnetic recording layer; and the other is to control the crystallinity of the magnetic recording layer. The interlayer material can be selected from Ru, Pt, Pd, W, Ti, Ta, Cr, Si, and alloys, oxides, and nitrides of these elements.

The magnetic recording layer mainly contains Co, also contains at least Pt, and can further contain a metal oxide. In addition to Co and Pt, the magnetic recording layer can also contain one or more elements selected from B, Ta, Mo, Cu, Nd, W, Nb, Sm, Tb, and Ru. When these elements are contained, it is possible to promote downsizing of magnetic grains, and improve the crystallinity and orientation, thereby obtaining recording/reproduction characteristics and thermal fluctuation characteristics for a high recording density. Practical examples of the material usable as the magnetic recording layer are alloys such as a CoPt-based alloy, a CoCr-based alloy, a CoCrPt-based alloy, CoPtO, CoPtCrO, CoPtSi, CoPtCrSi, and $CoCrSiO_2$.

The thickness of the magnetic recording layer can be set to 1.0 nm or more in order to measure a reproduced output signal with high accuracy, and can be set to 40 nm or less in order to suppress the distortion of the signal intensity. If the thickness is smaller than 1.0 nm, the reproduced output is extremely low, and the noise component becomes dominant. On the other hand, if the thickness is larger than 40 nm, the reproduced output becomes excessive, and the signal waveform is distorted.

A protective layer can be formed on the magnetic recording layer. The protective layer has the effect of preventing corrosion and deterioration of the magnetic recording layer, and preventing damage to the medium surface when a magnetic head comes in contact with the recording medium. Examples of the protective layer material are materials containing C, Pd, $SiO_2$, and $ZrO_2$. Carbon can be classified into $sp^2$-bonded carbon (graphite) and $sp^3$-bonded carbon (diamond). $sp^3$-bonded carbon is superior in durability and corrosion resistance, and $sp^2$-bonded carbon is superior in flatness. Carbon is normally deposited by sputtering using a graphite target, and amorphous carbon containing both $sp^2$-bonded carbon and $sp^3$-bonded carbon is deposited. Carbon in which the ratio of $sp^3$-bonded carbon is high is called diamond-like carbon (DLC). DLC is superior in durability, corrosion resistance, and flatness, and more effective as the protective layer of the magnetic recording layer.

Furthermore, a lubricating layer can be formed on the protective layer. Examples of a lubricant used in the lubricating layer are perfluoropolyether, alcohol fluoride, and fluorinated carboxylic acid.

A release layer can be formed on the layer to be processed and magnetic recording layer. After a projection pattern is transferred to the layer to be processed or magnetic recording layer, it is possible to apply a liftoff process of releasing the mask layer by removing the release layer. This release layer desirably has a high etching rate and a high dissolution rate with respect to a release solution.

Also, in another example of the magnetic recording medium manufacturing method, the layer to be processed can be used as an underlayer of the magnetic recording layer.

It is also possible to form an additional underlayer between this underlayer and the magnetic recording layer.

Examples of the material of the layer to be processed usable as the underlayer are silicon, germanium, tantalum, tungsten, molybdenum, hafnium, niobium, ruthenium, and oxides, nitrides, compounds, and alloys of these elements.

Examples of the additional underlayer are carbon, aluminum, titanium, vanadium, chromium, iron, nickel, germanium, palladium, and oxides, nitrides, compounds, and alloys of these elements.

Mask Layer Formation Step

A mask layer for transferring a projection pattern can be formed on the layer to be processed and magnetic recording layer.

The mask layer is a layer to which the metal microparticle projection pattern is transferred, and is a mask for transferring the projection pattern to the layer to be processed and magnetic recording layer formed below the mask layer. Accordingly, the etching selectivity when the mask layer/metal microparticle layer are formed in this order from the substrate side can be as high as possible, and the etching selectivity of the layer to be processed/mask layer is, of course, desirably high.

When the layer to be processed is the magnetic recording layer, the mask layer is formed on the protective layer on the magnetic recording layer. As described above, the etching selectivity of the magnetic recording layer/mask layer can also be increased.

The mask layer can be either a single layer or a multilayered film including two or more layers formed by stacking different materials.

The mask layer can have a thickness equal to or smaller than the radius of the metal microparticles in order to accurately transfer the microparticle projection pattern. This is so because if a layer having a thickness larger than the radius of the microparticles is processed, the aggregation of the microparticles during etching as will be described later becomes significant, and the transfer accuracy deteriorates. When a few ten-nm class pattern is assumed, a practical thickness is desirably 1 to 10 nm.

The mask layer is deposited by various methods like the layer to be processed, and can take various arrangements by taking account of the etching selectivity. That is, the mask layer can be either a single layer or a multilayered film including two or more layers formed by stacking different materials.

When using physical or chemical vapor deposition, the thickness of the mask layer can be adjusted by properly changing parameters such as the process gas pressure, gas flow rate, substrate temperature, input power, ultimate vacuum degree, chamber ambient, and deposition time. The arrangement accuracy of a metal microparticle layer to be formed on the mask layer and the transfer accuracy of the projection pattern strongly depend on the surface roughness of the mask layer. Therefore, the surface roughness of the mask layer can be reduced by variously adjusting the above-mentioned deposition conditions. To precisely process a narrow-pitch pattern, the period of the surface roughness can be made smaller than the desired pattern pitch. Also, the value of the average surface roughness is desirably 0.5 nm or less as a value including the substrate/layer to be processed/mask layer. If this value is larger than 0.5 nm, the arrangement accuracy of metal microparticles (to be described later) decreases, and the signal S/N of the magnetic recording medium decreases. However, the following method can enlarge the processing margin of the microparticle mask. Even when using a substrate having roughness larger than that of a conventional substrate, therefore, a projection pattern having a high dimensional accuracy and a few defects can be transferred to the mask layer.

The surface roughness can be reduced by variously changing the above-mentioned deposition conditions, or by changing the mask layer material from a crystalline material to an amorphous material.

The mask layer thickness can be determined by taking account of the etching selectivity to the release layer and magnetic recording layer formed below the mask layer, and the projection pattern dimensions.

A sputtering gas for use in deposition can mainly contain a rare gas such as Ar, and a desired alloy can be deposited by mixing a reactive gas such as $O_2$ or $N_2$ in accordance with a mask material to be deposited.

Also, the mask layer thickness can be set to 1 (inclusive) to 50 (inclusive) nm in order to precisely transfer a micropattern. If the thickness is smaller than 1 nm, no uniform mask layer can be deposited. If the thickness exceeds 50 nm, the projection pattern transfer accuracy in the depth direction tends to decrease. Furthermore, a projection pattern having a higher transfer accuracy can be obtained by forming a mask layer having a thickness equal to or smaller than the radius of the microparticles.

As will be described later, when a projection pattern is transferred to the layer to be processed and magnetic recording layer via the mask layer, the mask layer can be removed, or the mask layer can also be intentionally receded while the projection transfer pattern is formed, instead of the step of removing the mask layer. When removing the mask layer, a method such as dry etching or wet etching is applicable. It is also possible to preform a release layer between the layer to be processed and mask layer, and lift off the mask layer from the layer to be processed by removing this release layer.

As described previously, it is possible to form one mask layer or two or more mask layers. That is, a multilayered structure including first and second mask layers can be formed. By forming the first and second mask layers by using different materials, it is possible to increase the etching selectivity and improve the transfer accuracy. For the sake of convenience, the second mask layer will be called a transfer layer with respect to the first mask layer, and a description will be given like "a layer to be processed (including a magnetic recording layer)/mask layer/transfer layer from the substrate side".

This transfer layer can be appropriately selected from various materials by taking account of the etching selectivity to the metal microparticle material and mask layer material. When determining a combination of the mask materials, metal materials corresponding to an etching solution or etching gas can be selected. When combining materials by assuming dry etching, examples are C/Si, Si/Al, Si/Ni, Si/Cu, Si/Mo, Si/MoSi$_2$, Si/Ta, Si/Cr, Si/W, Si/Ti, Si/Ru, and Si/Hf in the order of the mask layer/transfer layer from the substrate side, and Si can be replaced with $SiO_2$, $Si_3N_4$, SiC, or the like. It is also possible to select multilayered structures such as Al/Ni, Al/Ti, Al/TiO$_2$, Al/TiN, Cr/Al$_2$O$_3$, Cr/Ni, Cr/MoSi$_2$, Cr/W, GaN/Ni, GaN/NiTa, GaN/NiV, Ta/Ni, Ta/Cu, Ta/Al, and Ta/Cr. Note that the stacking order of these various mask materials can be changed in accordance with an etching gas to be used in mask processing. The combination of the mask materials and the stacking order are not limited to those enumerated above, and can be appropriately selected from the viewpoints of the pattern dimensions and etching selectivity. Since patterning by wet etching is also possible as well as dry etching, each mask material can be selected by taking this into account.

When patterning the mask layer by wet etching, side etch in the widthwise direction of the projection pattern is suppressed. This can be realized by setting various parameters such as the composition of the mask material, the concentration of the etching solution, and the etching time.

Metal Microparticle Layer Formation Step

A metal microparticle layer for forming a projection pattern is formed on the mask layer. The metal microparticle layer formation step and projection pattern transfer step are divided into the following four steps: (1) a metal microparticle coating step, (2) a protective group amount reduction step, (3) an adhesive gas exposure step, and (4) a projection pattern transfer step.

As described previously, the microparticle material to be used in the embodiments is selected from the group consisting of C, Pt, Ni, Pd, Co, Al, Ti, Ce, Si, Fe, Au, Ag, Cu, Ta, Zr, Zn, Mo, W, and Ru.

Generally, noble-metal microparticles are chemically stable and hence have a dry etching resistance, so they can be used as materials that can increase the etching selectivity. Also, when compared to oxide microparticles, a Hamaker constant that determines the Van der Waals force is large, and the interaction between particles is strong. Accordingly, particles on the substrate surface tend to maintain monodispersion, and form a clear hexagonal array on the substrate surface, so the pitch variation decreases. On the other hand, a strong interaction between particles allows easy aggregation of microparticles. In addition, since the inter-particle distance shortens as the pitch narrows, the processing margin reduces. Furthermore, as the protective groups around the noble-metal microparticles disappear during dry etching, the noble-metal microparticles readily aggregate, and the transfer accuracy of the projection pattern decreases. Therefore, the narrow spacing processing accuracy has a trade-off relationship with a high etching selectivity and low pitch dispersion, so a technique that solves this problem is desired.

Aggregation as described above can be improved by modifying the metal microparticle surface. However, when modifying the microparticle surface by using another material in the stage of synthesizing metal microparticles, the microparticle size increases by the amount of shell covering the surface. In addition, two or more microparticles fuse to form so-called secondary particles, and this leads to a cause that worsens the monodispersed state in the dispersion. Since, therefore, the surfaces of the metal microparticles are simply modified without increasing the particle size, it is possible to shorten the manufacturing tact time and reduce the manufacturing cost.

The metal microparticles can be synthesized by various methods. For example, a liquid-phase reduction method and reverse micelle method are general.

A solvent to be used as the dispersion medium of the metal microparticles is selected from various solvents. More specifically, a solvent that prevents the aggregation of microparticles in the solvent is selected. More specifically, it is possible to select, e.g., toluene, xylene, hexane, heptane, octane, ethylene glycol monoethyl ether, ethylene glycol monomethyl ether, ethylene glycol monomethyl ether acetate, propylene glycol monomethyl ether acetate, ethylene glycol trimethyl ether, ethyl lactate, ethyl pyruvate, cyclohexanone, dimethylformamide, dimethylacetamide, tetrahydrofuran, anisole, diethylene glycol triethyl ether, alcohol, and water.

The concentration of the metal microparticles in the dispersion has influence on the uniformity of a coating film (to be described later), and hence can take an optimum range. In practice, however, various adjustments are necessary in accordance with a coating method. The solution concentration can be set at 5% or less as a mass percent concentration. This is so because if this concentration exceeds 5%, the in-plane dependence of the coating film thickness on the substrate significantly worsens.

Also, the protective group to be given to the metal microparticle surfaces is selected from various polymer materials. For example, it is possible to use polystyrene, polyethylene, polyvinyl pyrrolidone, polyhydroxy styrene, and polymethyl methacrylate.

The concentration of the polymer protective group can be appropriately adjusted with respect to the metal microparticles and dispersion medium concentration. More specifically, the concentration can be set within the range of 0.01% to 2% as a mass percent. If the concentration is lower than 0.01%, the wettability of the dispersion decreases, and a defective region (0-layer region) is formed in the film. If the concentration is higher than 2%, a metal microparticle multilayered structure is locally formed in the substrate. Also, if the concentration is higher than 2%, clusters of the metal microparticles readily form, and the amount of dust on the substrate often increases. In addition, the pitch variation of the microparticle pattern worsens as the polymer film thickness increases.

The layer to be processed is coated with the metal microparticle dispersion prepared as described above. The substrate surface can be coated with the dispersion by various methods. Practical examples are a spin coating method, spray costing method, spin casting method, dip coating method, inkjet method, Langmuir-Blodgett method, and Langmuir-Shaefer method. In each coating method, the substrate can be coated with a microparticle monolayer film by changing various parameters such as the dispersion concentration, spin rotational speed, and pulling rate. Also, secondary particles formed by aggregation have a relatively large particle size and may deteriorate the pattern uniformity. Therefore, these secondary particles are desirably filtered by using a membrane filter or the like.

Then, the first etching is performed in order to reduce the amount of protective group on the metal microparticle surfaces. As described earlier, the first etching cleaves and decomposes the microparticle protective group given during synthesis once.

Wet etching and dry etching are applicable as an etching method, and dry etching as nearly uniform etching can be used in order to reduce variations in the substrate surface.

An etching gas can be selected from various gases. For example, it is possible to apply inert gases such as He, Ne, Ar, and Kr, and reactive gases such as $H_2$, $O_2$, $F_2$, and $N_2$. When using an inert gas, a physical etching action for the metal microparticles and protective group is strong, so the processing margin significantly narrows. Therefore, it is desirable to apply a reactive gas that chemically decomposes the protective group, and particularly desirable to apply $O_2$ having a strong polymer decomposing action.

When applying dry etching in the first etching, this dry etching can be performed by adjusting parameters such as the antenna power, bias power, gas pressure, and ultimate vacuum degree. In this etching, the total covering solid component amount of the protective group covering the metal microparticles can be set at 70% or less. If the amount of protective group is larger than 70%, the substitution of the protective group performed by gas exposure (to be described later) is insufficient, and no large aggregation suppressing effect is achieved. Also, the conditions can be changed so that the protective group amount after etching is not 30% or less. If this amount is 30% or less, the microparticle interaction suppressing effect of the protective group decreases, and the metal microparticles aggregate with each other. This significantly deteriorates the variation of the mask pattern. In the first etching, therefore, the range of $30\% < wp \leq 70\%$ where wp is the protective group amount of the metal microparticles improves the compatibility to steps to be described later.

Subsequently, the protective group is given to the metal microparticle surfaces by exposure to an adhesive gas. Protective group amount reduction by dry etching and protective group giving by gas exposure as described above will be referred to as substitution of the protective group in series of steps. This gas exposure adheres a gas component to the metal microparticles and the terminal end of the protective group exposed by the first etching, thereby forming a new protective group. Conventionally, a protective group can be formed at a high density with respect to the protective group formed during synthesis. Accordingly, the aggregation of the microparticles can be suppressed in the projection pattern transfer step.

The adhesive gas can be selected from various gases, and a gas containing carbon and fluorine has strong adhesion. Practical examples are $CF_4$, $CHF_3$, $CH_3F$, $CH_2F_2$, $C_4F_6$, and $C_4F_8$, but the selection is not limited to these examples. When substituting the protective group on the metal microparticle surfaces with the adhesive gas, the sample is loaded into a vacuum chamber, and the gas is supplied. In this case, the amount and density of the protective group to be adhered to the metal microparticle surfaces can be changed by managing items such as the gas flow rate, gas supply time, ultimate vacuum degree, sample temperature, gas species, and gas mixing ratio. As the density of the protective group increases, the influence of aggregation during projection pattern transfer can be reduced. As the gas exposure conditions, it is possible to set the gas flow rate at 20 sccm or more, and the substrate temperature at 40° C. or more. If the gas flow rate is less than 20 sccm, the amount of gas adsorption around the microparticles reduces, so the protective group is not substituted. For the same reason, if the substrate temperature is 40° C. or less, the reactivity of the adhesive gas to the microparticles decreases, so it is impossible to sufficiently substitute the protective group.

Subsequently, the projection pattern is transferred to the layer to be processed as an underlayer in the second etching step. In the second etching, the pattern of the metal microparticle mask is transferred by changing various parameters of dry etching. In this step, aggregation occurs more rarely because, as described above, the protective group of the metal microparticle mask is substituted by the first etching and adhesive gas exposure, and the density of the protective group has increased. Details of the second etching step are nearly the same as a mask layer pattering step (to be described below).

Mask Layer Patterning Step

Then, the projection pattern is transferred to the mask layer by using the metal microparticles. As described previously, when the noble-metal microparticle surfaces are modified by the polymer, the obtained structure can be regarded as a system in which an island-like pattern of the microparticles and a sea-like pattern of the polymer coexist. In this case, the projection pattern of the microparticles can be transferred by removing the sea-like pattern.

When processing the mask layer, it is possible to implement various layer arrangements and processing methods by combining mask layer materials and etching gases.

Dry etching is applicable when performing micropatterning such that etching in the thickness direction of the projection pattern is significant with respect to etching in the widthwise direction. A plasma to be used in dry etching can be generated by various methods such as capacitive coupling, inductive coupling, electron cyclotron resonance, and multifrequency superposition coupling. Also, to adjust the pattern dimensions of the projection pattern, it is possible to set parameters such as the process gas pressure, gas flow rate, plasma input power, bias power, substrate temperature, chamber ambient, and ultimate vacuum degree.

When stacking mask materials in order to increase the etching selectivity, an etching gas can be appropriately selected. Examples of the etching gas are fluorine-based gases such as $CF_4$, $C_2F_6$, $C_3F_6$, $C_3F_8$, $C_5F_8$, $C_4F_8$, $ClF_3$, $CCl_3F_5$, $C_2ClF_5$, $CCBrF_3$, $CHF_3$, $NF_3$, and $CH_2F_2$, and chlorine-based gases such as $Cl_2$, $BCl_3$, $CCl_4$, and $SiCl_4$. Other various gases such as $H_2$, $N_2$, $O_2$, $Br_2$, $HBr$, $NH_3$, $CO$, $C_2H_4$, $He$, $Ne$, $Ar$, $Kr$, and $Xe$ can also be applied. It is also possible to use a gas mixture obtained by mixing two or more types of these gases in order to adjust the etching rate or etching selectivity. Note that patterning can also be performed by wet etching. In this case, it is favorable to select an etching solution capable of securing the etching selectivity and suppressing etching in the widthwise direction. Similarly, physical etching such as ion milling can be performed.

A micropattern can also be formed by nanoimprinting. In nanoimprinting, pattern transfer is performed by pressing a nanoimprinting stamper (to be referred to as a stamper hereinafter) having a projection micropattern formed on the surface against a transfer resist layer. Compared to step-and-repeat ultraviolet exposure or electron beam exposure, a resist pattern can be transferred to a large area of a sample at once. Since the manufacturing throughput increases, therefore, it is possible to shorten the manufacturing time and reduce the cost.

The stamper can be obtained from a substrate having a projection micropattern formed by lithography or the like, i.e., a so-called master template (mold or template). In many cases, the stamper is manufactured by electroforming the micropattern of the master template. As the substrate of the master template, it is possible to use Si, $SiO_2$, SiC, SiOC, $Si_3N_4$, C, or a semiconductor substrate in which an impurity such as B, Ga, In, or P is doped. Also, the three-dimensional shape of the substrate is not limited, so a circular, rectangular, or doughnut-like substrate can be used. A substrate made of a conductive material can also be used.

Subsequently, a stamper is manufactured by electroforming the projection pattern of the master template. Although various materials can be used as a plating metal, a method of manufacturing an Ni stamper will be explained as an example. First, a thin Ni film is deposited on the surface of the projection pattern of the master template in order to give conductivity to the projection pattern. If a conduction defect occurs during electroforming, plating growth is obstructed, and this leads to a pattern defect. Therefore, the thin Ni film can evenly be deposited on the upper surface and side surfaces of the projection pattern. Note that this film is formed to give conductivity, so the material is not limited to Ni.

Subsequently, the master template is dipped in an Ni sulfamate bath, and electroforming is performed by supplying an electric current. The film thickness after the plating, i.e., the thickness of the stamper can be adjusted by changing, e.g., the hydrogen ion concentration, temperature, and viscosity of the plating bath, the electric current value, and the plating time. This electroforming can be performed by electroplating or electroless plating. An Ni stamper is obtained by releasing the stamper obtained as described above from the substrate.

Note that the projection pattern is transferred to the resist layer by using the obtained stamper. In this step, a duplicated stamper can be manufactured by using the stamper in place of the master template. Examples are a method of obtaining an Ni stamper from an Ni stamper, and a method of obtaining a resin stamper from an Ni stamper. In this specification, a method of manufacturing a resin stamper will be explained.

A resin stamper is manufactured by injection molding. First, an Ni stamper is loaded into an injection molding apparatus, and injection molding is performed by supplying a resin solution material to the projection pattern of the stamper. As the resin solution material, it is possible to apply a cycloolefin polymer, polycarbonate, or polymethyl methacrylate, and select a material having a high removability with respect to an imprint resist. After the injection molding is performed, a resin stamper having the projection pattern is obtained by releasing the sample from the Ni stamper.

The projection pattern is transferred to the resist layer by using this resin stamper.

As the resist, it is possible to use a resist material such as a thermosetting resin or photosetting resin. Examples are isobornyl acrylate, allyl methacrylate, and dipropylene glycol diacrylate.

A sample including the magnetic recording layer and mask layer as described above is coated with any of these resist materials, thereby forming a resist layer. Then, a resin stamper having a projection pattern is imprinted on the resist layer. When the resist stamper is pressed against the resist during this imprinting, the resist fluidifies and forms a projection pattern. The resist layer forming the projection pattern is cured by applying energy such as ultraviolet light to the resist layer. Then, the projection pattern of the resist layer is obtained by releasing the resin stamper. To facilitate releasing the resin stamper, a release treatment using a silane coupling agent or the like can be performed on the surface of the resin stamper beforehand.

Since the resist material remains as a residue in the recesses of the resist layer after the resin stamper is released, the surface of the mask layer is exposed by etching away the residue. The residue can easily be removed by etching using $O_2$ gas, because a polymer-based resist material generally has a low etching resistance against an $O_2$ etchant. If an inorganic material is contained, an etchant can properly be changed so that the resist pattern remains. As described above, the projection pattern can be formed on the resist layer by nanoimprinting. As described above, the projection pattern of the metal microparticles can be transferred to the mask layer without any aggregation.

Layer to be Processed Patterning Step

Subsequently, the projection pattern transferred to the mask layer is transferred to the lower layer to be processed. This layer to be processed corresponds to a magnetic recording layer in a magnetic recording medium manufacturing method.

When forming the projection pattern on the layer to be processed, various processing methods can be selected like the above-described mask layer. However, dry etching can be applied in order to decrease a dimensional conversion difference in the widthwise direction and advance processing in the thickness direction. Note that no aggregation of metal microparticles occurs due to etching when the microparticles are removed from the mask layer before the layer to be processed formation step. Accordingly, the projection pattern transfer accuracy can be improved.

Also, when a noble-metal material that hardly forms a byproduct by reactive dry etching is used as the layer to be processed, a method such as ion milling need only be applied. More specifically, an inert gas such as He, Ne, Ar, Xe, or Kr can be used, and it is also possible to perform patterning by reactive ion milling to which a gas such as $O_2$ or $N_2$ is added.

When patterning the layer to be processed, the relationship between an etching rate ERmask of the mask layer and an etching rate ERmat of the layer to be processed desirably satisfies ERmask≤ERmat. That is, to obtain desired thicknesses of the layer to be processed and magnetic recording layer, the reduction in amount of the mask layer caused by etching can be decreased.

When transferring the projection pattern to the layer to be processed by ion milling, it is important to suppress a byproduct, i.e., a so-called redeposition component that scatters toward the mask sidewalls as the processing advances. Since this redeposition component adheres around the projection pattern mask, the projection pattern dimensions increase and fill the grooves. To obtain divided projection patterns, therefore, it is possible to reduce the redeposition component as soon as possible.

When performing ion milling on the layer to be processed, the redeposition component on the sidewalls can be reduced by changing the ion incident angle. Although an optimum incident angle changes in accordance with the mask height, redeposition can be suppressed within the range of 20° to 70°. Also, the ion incident angle can appropriately be changed during milling. An example is a method in which after the layer to be processed is milled at an ion incident angle of 0°, the redeposition component on the projection pattern is selectively removed by changing the ion incident angle.

Protective Layer Formation Step

In the magnetic recording medium manufacturing method in which a magnetic recording layer is the layer to be processed, a magnetic recording medium having the projection pattern can be obtained by finally depositing a carbon-based protective layer and a fluorine-based lubricating film (not shown) on the magnetic recording layer having the projection pattern.

As the carbon protective layer, a DLC film containing a large amount of $sp^3$-bonded carbon can be used. The film thickness of the protective layer is set to 2 nm or more in order to maintain the coverage, and 10 nm or less in order to maintain the signal S/N. Also, perfluoropolyether, alcohol fluoride, or fluorinated carboxylic acid can be used as a lubricant.

Figure 9:
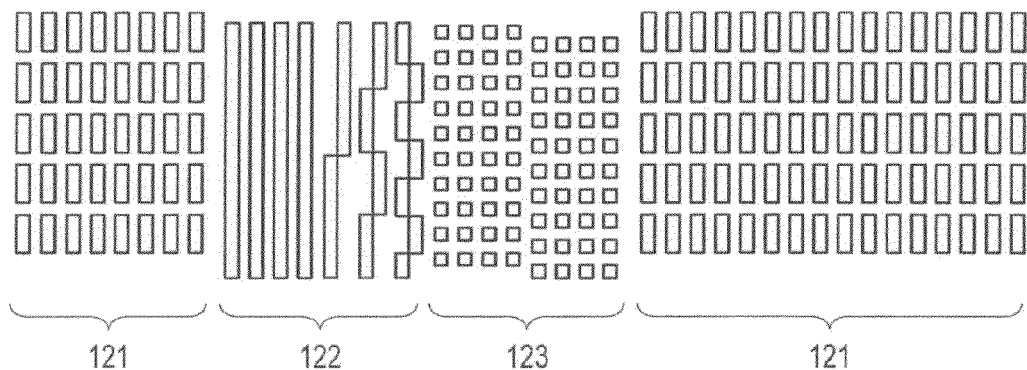
FIG. 9 is a view showing examples of recording bit patterns formed along the circumferential direction of a magnetic recording medium.

FIG. 9 is a view showing examples of recording bit patterns in the circumferential direction of the magnetic recording medium.

As shown in FIG. 9, the projection patterns of the magnetic recording layer are roughly classified into a recording bit area 121 for recording data corresponding to 1 and 0 of digital signals, and a so-called servo area 124 including a preamble address pattern 122 as a magnetic head positioning signal, and a burst pattern 123. These patterns can be formed as in-plane patterns. Also, the patterns in the servo area shown in FIG. 9 need not have rectangular shapes. For example, all the servo patterns may also be replaced with dot-like patterns.

Figure 10:
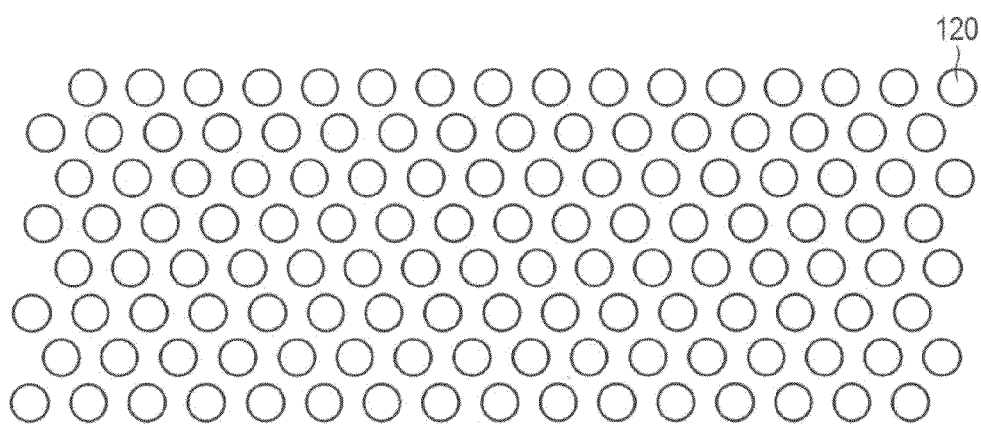
FIG. 10 is a view showing another example of the recording bit pattern formed along the circumferential direction of a magnetic recording medium.

Furthermore, as shown in FIG. 10, not only the servo area but also the data area can entirely be formed by a dot pattern 120. One-bit information can be formed by one magnetic dot or a plurality of magnetic dots.

Figure 11:
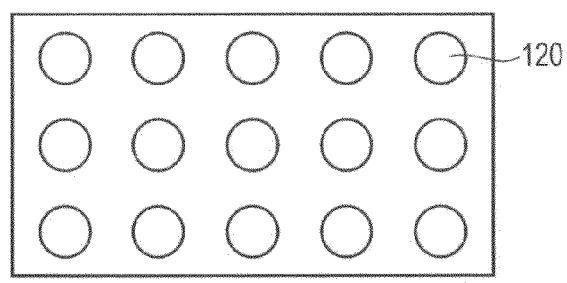
FIG. 11 is a view showing still another example of the recording bit pattern formed along the circumferential direction of a magnetic recording medium.

It is also possible to arrange the dots forming the pattern into squares, as shown in FIG. 11.

Figure 12:
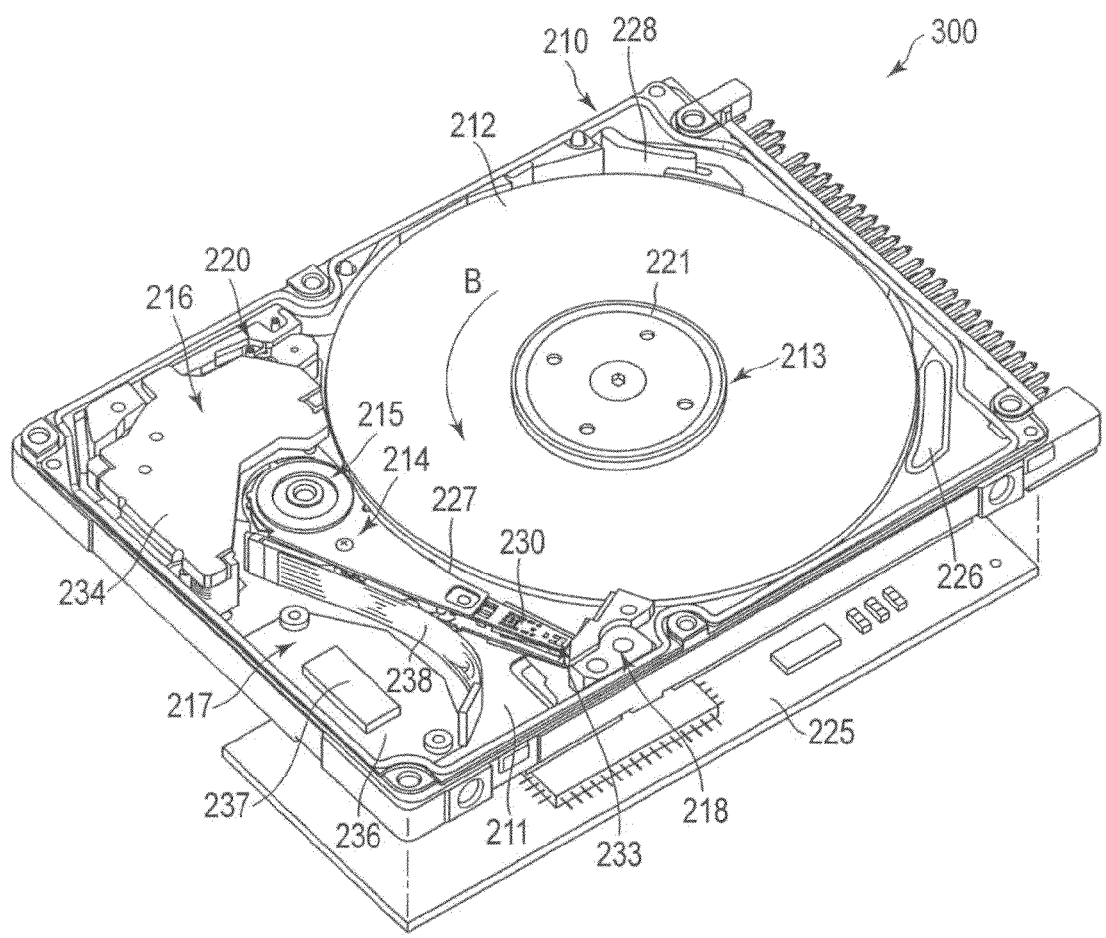
FIG. 12 is a partially exploded perspective view showing an example of a magnetic recording/reproduction apparatus to which the magnetic recording medium according to the embodiment is applicable.

FIG. 12 is a partially exploded perspective view showing an example of a magnetic recording/reproduction apparatus to which the magnetic recording medium according to the embodiment is applicable.

As a disk apparatus 300, FIG. 12 shows the internal structure of a hard disk drive (HDD) according to the embodiment by removing its top cover. As shown in FIG. 12, the HDD includes a housing 210. The housing 210 includes a rectangular boxy base 211 having an open upper end, and a rectangular plate-like top cover (not shown). The top cover is fixed to the base by a plurality of screws, and closes the open upper end of the base. Consequently, the interior of the housing 210 is airtightly held, and can communicate with the outside through only a breathing filter 226.

A magnetic disk 212 as a recording medium and a driving unit are arranged on the base 211. The driving unit includes a spindle motor 213 for supporting and rotating the magnetic disk 212, a plurality of, e.g., two magnetic heads 233 for performing information recording and reproduction on the magnetic disk, a head actuator 214 for supporting the magnetic heads 233 such that they can freely move over the surface of the magnetic disk 212, and a voice coil motor (to be referred to as a VCM hereinafter) 216 for pivoting and positioning the head actuator. A ramped loading mechanism 218, inertia latch 220, and substrate unit 217 are also arranged on the base 211. The ramped loading mechanism 218 holds the magnetic heads 233 in a position spaced apart from the magnetic disk 212 when the magnetic heads 233 have moved to the outermost circumference of the magnetic disk 212. The inertia latch 220 holds the head actuator 214 in a retracted position when an impact or the like acts on the HDD. The substrate unit 217 includes electronic parts such as a preamplifier and head IC.

A control circuit board 225 is screwed to the outer surface of the base 211, and faces the bottom wall of the base 211. The control circuit board 225 controls the operations of the spindle motor 213, VCM 216, and magnetic heads 233 via the substrate unit 217.

Referring to FIG. 12, the magnetic disk 212 is formed as a perpendicular magnetic recording medium having a projection pattern formed by the above-described processing method. Also, as described previously, the magnetic disk 212 has a substrate 219 made of a disk-like nonmagnetic member having a diameter of about 2.5 inches. On each surface of the substrate 219, a soft magnetic layer 223 as an underlayer and a perpendicular magnetic recording layer 222 having magnetic anisotropy perpendicular to the disk surface are sequentially stacked. A protective film 224 is formed on the perpendicular magnetic recording layer 222.

Also, the magnetic disk 212 is coaxially fitted on a hub of the spindle motor 213 and fixed to the hub by being clamped by a clamp spring 221 screwed to the upper end of the hub. The spindle motor 213 as a driving motor rotates the magnetic disk 212 at a predetermined speed in the direction of an arrow B.

The head actuator 214 includes a bearing 215 fixed on the bottom wall of the base 211, and a plurality of arms 227 extending from the bearing. The arms 227 are arranged parallel to the surface of the magnetic disk 212, spaced apart from each other at a predetermined distance, and extend in the same direction from the bearing 215. The head actuator 214 includes elastically deformable narrow plate-like suspensions 230. The suspensions 230 are formed by leaf springs, and have proximal ends fixed to the distal ends of the arms 227 by spot welding or adhesion and extending from the arms. The magnetic heads 233 are supported by the extended ends of the suspensions 230 via gimbal springs 241. The suspensions 230, gimbal springs 241, and magnetic heads 233 form a head gimbal assembly. Note that the head actuator 214 may also have a so-called E block formed by integrating a sleeve of the bearing 215 and the plurality of arms.

EXAMPLES

The embodiments will be explained in detail below.

Example 1

Examples 1 to 19 are results obtained when the metal microparticle material was Au having a particle size of 8 nm and a pitch of 13.5 nm, and the etching conditions were variously changed.

Table 1 (to be presented later) shows the type and average particle size of the metal microparticles, the first etching conditions, the gas exposure conditions, the second etching conditions, and the glide evaluation results.

In Example 1, dry etching using $O_2$ gas was applied as the first etching, $CHF_3$ was applied as the adhesive gas, and dry etching using $CHF_3$ was applied as the second etching.

First, a microparticle coating solution for forming a metal microparticle mask was prepared. This microparticle coating solution was obtained by monodispersing the metal microparticle material in a solvent. Toluene was used as the solvent, and Au microparticles containing alkane thiol as the protective group were used. The toluene solvent was added such that the weight percent concentration of the dispersion of the Au microparticles was 3.0%, thereby preparing a coating solution. In addition, ultrasonic dispersion was performed for 90 min after the coating solution was prepared in order to promote monodispersion of the microparticles, thereby preparing a final coating solution.

Then, a projection pattern formation substrate was formed. A 2.5-inch, doughnut-like glass disk was used as a substrate, and an Si layer to be processed was formed on the substrate. The Si layer to be processed was deposited by DC sputtering. This sputtering deposition was performed by setting the Ar gas pressure at 0.7 Pa and the input power at 500 W, so that the thickness was 5 nm.

Subsequently, the prepared microparticle coating solution was dropped on the layer to be processed by using an automatic syringe, and spin coating was performed at a rotational speed of 5,000 rpm, thereby obtaining an Au microparticle monolayer.

Note that a "monolayer" herein mentioned means a state in which, as described previously, microparticles are arranged into a single layer without having any hierarchical structure in the same plane.

Figure 13:
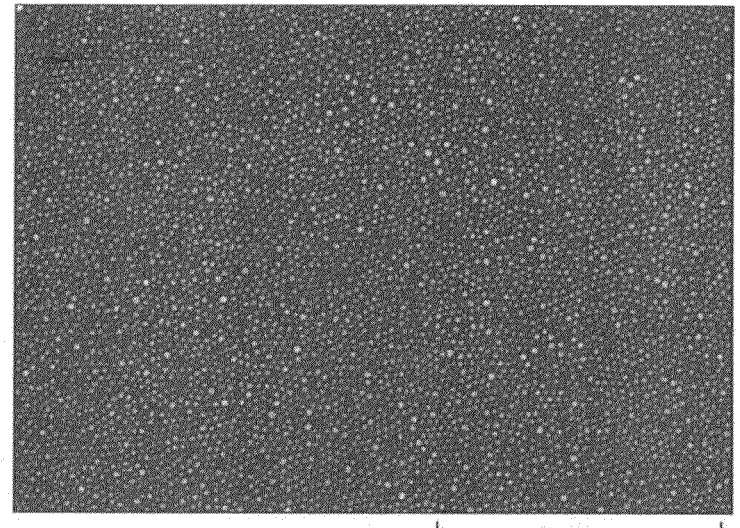
FIG. 13 is a photograph showing an upper-surface SEM image of a metal microparticle mask according to the embodiment.

FIG. 13 is a photograph showing an SEM image obtained by observing the Au microparticle monolayer formed on the substrate by using a scanning electron microscope (SEM).

As shown in FIG. 13, the Au microparticles maintained a dispersed state from each other, and no aggregation was found on the substrate. Also, when the thickness of the metal microparticle layer was measured using an atomic force microscope (AFM), a step of 9 nm was found, i.e., it was confirmed that the microparticles were nearly formed into a monolayer.

Then, the microparticle layer surface was exposed by removing the protective group from the Au microparticle surfaces by the first etching. In this step, the protective group was removed by dry etching using $O_2$ gas as an etchant. In the first etching, the protective group amount was reduced by performing inductively coupled plasma reactive ion etching for 15 sec by setting the antenna power at 30 W, the bias power at 2 W, the $O_2$ gas pressure at 20 sccm, and the gas pressure at 0.1 Pa. Under the conditions, about 60% of the protective group on the metal microparticle surfaces can be removed.

Subsequently, the protective group around the microparticles was substituted by exposing the sample to the adhesive gas. In this step, a dry etching chamber was used, and, after the substrate temperature was set at 40° C., the protective group was substituted by exposing the sample for 30 sec by using $CHF_3$ set at a gas flow rate of 40 sccm.

In addition, the projection pattern of the metal microparticles was transferred to the layer to be processed by the second etching. In this step, the layer to be processed was 5-nm thick Si, and readily processable by $CHF_3$ gas. Projection pattern transfer having a wider processing margin can be realized by using the same gas as the adhesive gas and second etching gas. This is so because the same gas as that in the adhesive gas exposure step is continuously adsorbed to the microparticle surfaces in the second etching step, and the processing margin can be made wider than that when using a reactive gas or the like. In the second etching using $CHF_3$, the metal microparticle pattern was transferred by performing etching for an etching time of 12 sec at an antenna power of 100 W, a bias power of 30 W, a gas flow rate of 20 sccm, and a gas pressure of 0.1 Pa.

Finally, the Au microparticles were removed from the Si film surface by using an iodine/potassium iodide/isopropyl alcohol stripping solution mixture. The stripping solution mixture was prepared by using iodine:potassium iodide:isopropyl alcohol at a weight ratio of 1:1:12, and Au was dissolved by dipping the sample for 10 sec. Furthermore, a 5-nm thick Si projection pattern was obtained by performing rinsing by using isopropyl alcohol.

Figure 14:
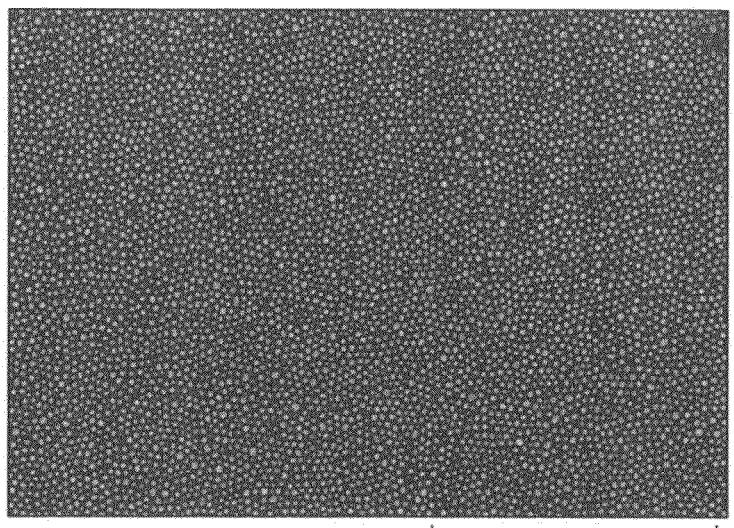
FIG. 14 is a photograph showing an upper-surface SEM image of a projection pattern formed by using the metal microparticle mask according to the embodiment.
Figure 15:
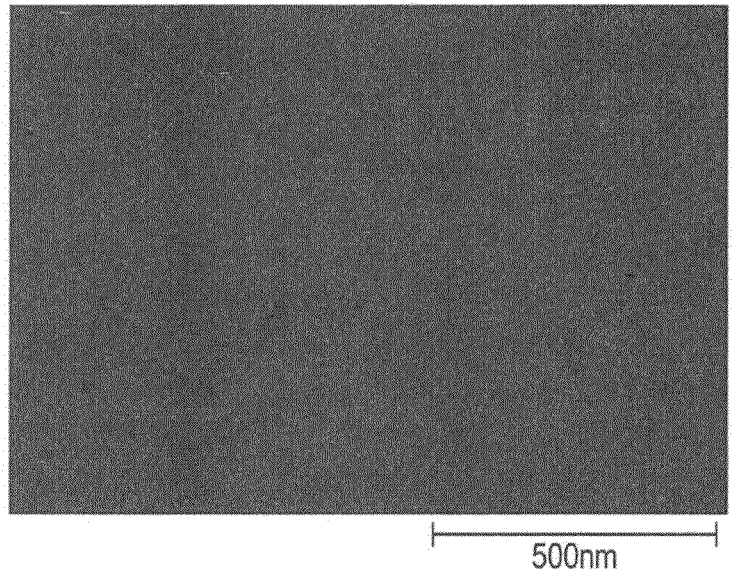
FIG. 15 is a photograph showing an upper-surface SEM image of another example of the metal microparticle mask according to the embodiment.

FIGS. 14 and 15 are photographs showing upper-surface SEM images of micropatterns after the second etching and after the Au microparticle removal, respectively.

As shown in FIGS. 14 and 15, the microparticles were kept isolated after etching, and the projection pattern did not aggregate. Likewise, the projection pattern was clear even after the microparticles were removed, i.e., the pattern of the metal microparticles was transferred. As described above, the micropattern of the metal microparticles was transferred to the layer to be processed.

Next, a magnetic recording medium manufacturing method when the layer to be processed was a transfer layer and a mask layer and magnetic recording layer were formed as underlayers will be explained.

First, a magnetic recording layer was formed on a substrate. A 2.5-inch doughnut substrate was used as the substrate, and the magnetic recording layer was formed on the substrate by DC sputtering. That is, Ar was used as a process gas, and the gas pressure, gas flow rate, and input power were respectively set at 0.7 Pa, 35 sccm, and 500 W. The magnetic recording layer was obtained by sequentially depositing a 10-nm thick NiTa underlayer/4-nm thick Pd underlayer/20-nm thick Ru underlayer/3-nm thick CoPt recording layer from the substrate side, and finally forming a 1-nm thick Pd protective layer.

Then, a mask layer was formed. A C film was selected as the mask layer, and an Si film was used as a transfer layer on the mask layer in order to improve the transfer accuracy. The two mask layers were formed by DC sputtering by setting the thickness of the C film to 15 nm, and the thickness of the Si film to 5 nm.

Subsequently, an Au microparticle mask layer was formed on the Si transfer layer as described above, and the projection pattern was transferred to the Si layer, thereby obtaining an Si projection pattern having a height of 5 nm. When transferring the projection pattern to the C mask layer, dry etching using $O_2$ gas as an etchant was applied, and the projection pattern was transferred to the C film by performing etching for 29 sec by setting the gas pressure at 0.1 Pa, the gas flow rate at 20 sccm, the antenna power at 40 W, and the bias power at 40 W.

Subsequently, the projection pattern was transferred to the magnetic recording layer. When transferring the projection pattern to the magnetic recording layer, ion milling was applied. In this step, a milling method using Ar ions was applied. The projection pattern was transferred to the CoPt recording layer by performing milling for 55 sec at an Ar ion acceleration voltage of 300 V, a gas flow rate of 3 sccm, and a process pressure of 0.1 Pa, by setting the ion species incident angle to the substrate surface at 90° (perpendicular incidence). The Si transfer layer and C mask layer disappeared during ion milling, and hence did not remain on the CoPt recording layer.

Finally, a 2-nm thick DLC film was deposited, and a 1.5-nm thick perfluoropolyether-based lubricating film was formed after that, thereby obtaining a magnetic recording medium having the projection pattern.

A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 2

Example 2 is an example in which the in-plane variation of a pattern was reduced by improving the coating properties of a microparticle mask by adding a polymer binder when preparing an Au microparticle solution. The mask layer formation step, Au microparticle coating solution coating step, Si transfer step, C transfer step, and magnetic recording layer transfer step were the same as those of Example 1.

When adding the polymer binder, a polymer binder material was first dissolved in toluene as a dispersion medium. In addition, the Au microparticle coating solution concentration was adjusted by adding the obtained solution to a dispersion. A polystyrene/toluene solution having a weight percent concentration of 1.0% was prepared by using polystyrene having a molecular weight of 2,000 as the polymer binder material. This solution was added to an Au dispersion, thereby preparing an Au microparticle solution such that the Au microparticle concentration was 2.8 wt % as a weight percent concentration.

After that, an Si projection pattern having a height of 5 nm was obtained by performing Au microparticle coating and projection pattern transfer to an Si film. Furthermore, a projection pattern was transferred to a magnetic recording layer via Si and C mask layers. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 3

Example 3 is a result obtained when the gas flow rate was changed in the adhesive gas exposure step performed for an Au microparticle mask layer. The Au microparticle mask layer formation step, projection pattern transfer step, and magnetic recording layer formation step were the same as those of Example 1.

$CHF_3$ was used as the adhesive gas and supplied into a chamber by adjusting the gas flow rate to 10 sccm, thereby giving the gas component as a protective group to the metal microparticle surfaces.

After that, an Si projection pattern having a height of 5 nm was obtained by performing projection pattern transfer to a mask layer. Furthermore, the projection pattern was transferred to a magnetic recording layer via Si and C mask layers. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 4

Example 4 is a result obtained when the gas flow rate was changed in the adhesive gas exposure step performed for an Au microparticle mask layer in the same manner as in Example 3. The Au microparticle mask layer formation step, projection pattern transfer step, and magnetic recording layer formation step were the same as those of Example 1.

$CHF_3$ was used as the adhesive gas and supplied into a chamber by adjusting the gas flow rate to 20 sccm, thereby giving the gas component as a protective group to the metal microparticle surfaces.

After that, an Si projection pattern having a height of 5 nm was obtained by performing projection pattern transfer to a mask layer. Furthermore, the projection pattern was transferred to a magnetic recording layer via Si and C mask layers. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 5

Example 5 is a result obtained when the gas flow rate was changed in the adhesive gas exposure step performed for an Au microparticle mask layer in the same manner as in Example 3. The Au microparticle mask layer formation step, projection pattern transfer step, and magnetic recording layer formation step were the same as those of Example 1.

$CHF_3$ was used as the adhesive gas and supplied into a chamber by adjusting the gas flow rate to 30 sccm, thereby giving the gas component as a protective group to the metal microparticle surfaces.

After that, an Si projection pattern having a height of 5 nm was obtained by performing projection pattern transfer to a mask layer. Furthermore, the projection pattern was transferred to a magnetic recording layer via Si and C mask layers. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 6

Example 6 is a result obtained when the gas flow rate was changed in the adhesive gas exposure step performed for an Au microparticle mask layer in the same manner as in Example 3. The Au microparticle mask layer formation step, projection pattern transfer step, and magnetic recording layer formation step were the same as those of Example 1.

$CHF_3$ was used as the adhesive gas and supplied into a chamber by adjusting the gas flow rate to 50 sccm, thereby giving the gas component as a protective group to the metal microparticle surfaces.

After that, an Si projection pattern having a height of 5 nm was obtained by performing projection pattern transfer to a mask layer. Furthermore, the projection pattern was transferred to a magnetic recording layer via Si and C mask layers. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 7

Example 7 is a result obtained when the gas flow rate was changed in the adhesive gas exposure step performed for an Au microparticle mask layer in the same manner as in Example 3. The Au microparticle mask layer formation step, projection pattern transfer step, and magnetic recording layer formation step were the same as those of Example 1.

$CHF_3$ was used as the adhesive gas and supplied into a chamber by adjusting the gas flow rate to 60 sccm, thereby giving the gas component as a protective group to the metal microparticle surfaces.

After that, an Si projection pattern having a height of 5 nm was obtained by performing projection pattern transfer to a mask layer. Furthermore, the projection pattern was transferred to a magnetic recording layer via Si and C mask layers. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 8

Examples 8 to 10 are results obtained when the etching gas species was changed in projection pattern formation performed by the second etching. The Au microparticle mask layer formation step, projection pattern transfer step, and magnetic recording layer formation step were the same as those of Example 1.

$CF_4$ was used as the gas species to be used in the second etching. An Si projection pattern having a height of 5 nm was formed by performing etching for 12 sec by setting the antenna power at 100 W, the bias power at 5 W, the gas flow rate at 20 sccm, and the gas pressure at 0.1 Pa, as the dry etching conditions.

After that, a projection pattern was transferred to a magnetic recording layer via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 9

Example 9 is a result obtained when the etching gas species was changed to $C_4F_8$ in projection pattern formation performed by the second etching. The Au microparticle mask layer formation step, projection pattern transfer step, and magnetic recording layer formation step were the same as those of Example 1.

An Si projection pattern having a height of 5 nm was formed by performing $C_4F_8$ dry etching for 8 sec by setting the antenna power at 100 W, the bias power at 5 W, the gas flow rate at 20 sccm, and the gas pressure at 0.1 Pa.

After that, a projection pattern was transferred to a magnetic recording layer via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 10

Example 10 is a result obtained when the etching gas species was changed to $CH_3F$ in projection pattern formation performed by the second etching. The Au microparticle mask layer formation step, projection pattern transfer step, and magnetic recording layer formation step were the same as those of Example 1.

An Si projection pattern having a height of 5 nm was formed by performing etching for 8 sec by setting the antenna power at 100 W, the bias power at 5 W, the gas flow rate at 20 sccm, and the gas pressure at 0.1 Pa, as the $CH_3F$ dry etching conditions.

After that, a projection pattern was transferred to a magnetic recording layer via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 11

Examples 11 to 13 are results obtained when the adhesive gas materials and the gas materials in the second etching in Examples 8 to 10 were switched.

This example is a result obtained when the adhesive gas material was $CF_4$ and the gas material in the second etching was $CHF_3$, and includes the same steps as those of Example 1 except steps pertaining to the supply and exposure of the adhesive gas.

A sample heated to 40° C. was exposed to $CF_4$ gas for 30 sec at a gas flow rate of 40 sccm and a gas pressure of 0.1 Pa, thereby giving a protective group around microparticles.

After that, an Si projection pattern having a height of 5 nm was obtained by performing projection pattern transfer in the same manner as in Example 1. Furthermore, the projection pattern was transferred to a magnetic recording layer via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 12

Example 12 is a result obtained when the adhesive gas material was $C_4F_8$ and the gas material in the second etching was $CHF_3$, and includes the same steps as those of Example 1 except steps pertaining to the supply and exposure of the adhesive gas.

A sample heated to 40° C. was exposed to $C_4F_8$ gas for 30 sec at a gas flow rate of 40 sccm and a gas pressure of 0.1 Pa, thereby giving a protective group around microparticles.

After that, an Si projection pattern having a height of 5 nm was obtained by performing projection pattern transfer in the same manner as in Example 1. Furthermore, the projection pattern was transferred to a magnetic recording layer via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 13

Example 13 is a result obtained when the adhesive gas material was $CH_3F$ and the gas material in the second etching was $CHF_3$, and includes the same steps as those of Example 1 except steps pertaining to the supply and exposure of the adhesive gas.

A sample heated to 40° C. was exposed to $CH_3F$ gas for 30 sec at a gas flow rate of 40 sccm and a gas pressure of 0.1 Pa, thereby giving a protective group around microparticles.

After that, an Si projection pattern having a height of 5 nm was obtained by performing projection pattern transfer in the same manner as in Example 1. Furthermore, the projection pattern was transferred to a magnetic recording layer via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 14

Examples 14 to 17 are results obtained when the gas material and etching conditions in the second etching step were variously changed. The mask layer formation step, magnetic recording layer formation step, protective group removing step, adhesive gas exposure step, and the projection transfer step were the same as those of Example 1.

Ar was used as the second etching gas. In the second etching, inductively coupled plasma reactive etching was performed for 20 sec by supplying Ar gas at a gas flow rate of 20 sccm, a gas pressure of 0.1 Pa, an antenna power of 50 W, and a bias power of 80 W, thereby obtaining an Si projection pattern having a height of 5 nm. Then, a projection pattern was transferred to a magnetic recording layer via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 15

Example 15 is an example in which the layer to be processed was AlBN and the second etching gas was $Cl_2$, and magnetic recording layer formation step, the mask layer formation step, protective group removing step, adhesive gas exposure step, and projection pattern transfer step were the same as those of Example 1.

The AlBN layer to be processed was deposited by DC sputtering at a gas flow rate of 50 sccm, a gas pressure of 0.7 Pa, and an input power of 500 W. Also, in the second etching using $Cl_2$, etching was performed for 10 sec at a gas flow rate of 20 sccm, a gas pressure of 0.1 Pa, an antenna power of 200 W, and a bias power of 40 W. Then, the sample surface was washed with pure water, and the sample was dried on a hotplate heated to 200° C. Thus, an AlBN projection pattern having a height of 5 nm was obtained.

After that, a magnetic recording medium was obtained by transferring the projection pattern to a magnetic recording layer in the same manner as in Example 1. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 16

Example 16 is an example in which the second etching gas was $BCl_3$, and the mask layer formation step, magnetic recording layer formation step, protective group removing step, adhesive gas exposure step, projection pattern transfer step, and magnetic recording layer formation step were the same as those of Example 15.

In the second etching using $BCl_3$, etching was performed for 6 sec at a gas flow rate of 40 sccm, a gas pressure of 0.1 Pa, an antenna power of 100 W, and a bias power of 80 W. Then, the sample surface was washed with pure water, and the sample was dried on a hotplate heated to 200° C. Thus, an AlBN projection pattern having a height of 5 nm was obtained.

After that, a magnetic recording medium was obtained by transferring the projection pattern to a magnetic recording layer in the same manner as in Example 1. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 17

Example 17 is an example in which the second etching gas was $SF_6$, and the mask layer formation step, magnetic recording layer formation step, protective group removing step, adhesive gas exposure step, projection pattern transfer step, and magnetic recording layer formation step were the same as those of Example 15.

In the second etching using $SF_6$, etching was performed for 12 sec at a gas flow rate of 20 sccm, a gas pressure of 0.1 Pa, an antenna power of 100 W, and a bias power of 30 W. Then, the sample surface was washed with pure water, and the sample was dried on a hotplate heated to 200° C. Thus, an AlBN projection pattern having a height of 5 nm was obtained.

After that, a magnetic recording medium was obtained by transferring the projection pattern to a magnetic recording layer in the same manner as in Example 1. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 18

Examples 18 and 19 are examples using diluent gases by supplying different types of gases to $CHF_3$ as the second etching gas. The mask layer formation step, magnetic recording layer formation step, protective group removing step, adhesive gas exposure step, projection pattern transfer step, and magnetic recording layer formation step were the same as those of Example 1.

In Example 18, Ar was selected as the diluent gas and supplied at a flow rate of 20 sccm in the second etching. Then, after a gas mixture of Ar and $CHF_3$ stabilized in a chamber, etching was performed for 17 sec at a gas pressure of 0.1 Pa, an antenna power of 100 W, and a bias power of 5 W. Then, the sample surface was washed with pure water, and the sample was dried on a hotplate heated to 200° C. Thus, an Si projection pattern having a height of 5 nm was obtained.

After that, a magnetic recording medium was obtained by transferring the projection pattern to a magnetic recording layer in the same manner as in Example 1. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 19

Example 19 is an example in which the type of diluent gas in the second etching was $O_2$, and the mask layer formation step, magnetic recording layer formation step, protective group removing step, adhesive gas exposure step, projection pattern transfer step, and magnetic recording layer formation step were the same as those of Example 18.

In the second etching, the $O_2$ diluent gas was supplied at a flow rate of 20 sccm. Then, after a gas mixture of $O_2$ diluent gas and $CHF_3$ stabilized in a chamber, etching was performed for 14 sec at a gas pressure of 0.1 Pa, an antenna power of 100 W, and a bias power of 30 W. Then, the sample surface was washed with pure water, and the sample was dried on a hotplate heated to 200° C. Thus, an Si projection pattern having a height of 5 nm was obtained.

After that, a magnetic recording medium was obtained by transferring the projection pattern to a magnetic recording layer in the same manner as in Example 1. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 20

Examples 20 to 37 are examples in which the type of metal microparticle mask material was variously changed. Table 2 (to be presented later) shows the type and average particle size of the metal microparticles, the first etching conditions, the gas exposure conditions, the second etching conditions, and the glide evaluation results. The metal microparticle adjusting step, coating step, mask layer formation step, magnetic recording layer formation step, protective group removing step, adhesive gas exposure step, projection pattern transfer step, and magnetic recording layer formation step were the same as those of Example 1.

In Example 20, C having an average particle size of 8.2 nm was used as the metal microparticle material, and a metal microparticle mask layer was formed by coating of a toluene dispersion.

After that, a projection pattern was transferred to a layer to be processed in the same manner as in Example 1, thereby obtaining an Si projection pattern having a height of 5 nm. In addition, a magnetic recording medium was obtained by transferring the projection pattern via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 21

Example 21 is an example in which Al having an average particle size of 15.3 nm was used as the metal microparticle material, and a metal microparticle mask layer was formed by coating of an isopropyl alcohol dispersion. The metal microparticle adjusting step, coating step, mask layer formation step, magnetic recording layer formation step, protective group removing step, adhesive gas exposure step, projection pattern transfer step, and magnetic recording layer formation step were the same as those of Example 1.

After that, a projection pattern was transferred to a layer to be processed in the same manner as in Example 1, thereby obtaining an Si projection pattern having a height of 5 nm. In addition, a magnetic recording medium was obtained by transferring the projection pattern via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 22

Example 22 is an example in which Si having an average particle size of 19.8 nm was used as the metal microparticle material, and a metal microparticle mask layer was formed by coating of a toluene dispersion. The metal microparticle adjusting step, coating step, mask layer formation step, magnetic recording layer formation step, protective group removing step, adhesive gas exposure step, projection pattern transfer step, and magnetic recording layer formation step were the same as those of Example 1.

After that, a projection pattern was transferred to a layer to be processed in the same manner as in Example 1, thereby obtaining an Si projection pattern having a height of 5 nm. In addition, a magnetic recording medium was obtained by transferring the projection pattern via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 23

Example 23 is an example in which Ti having an average particle size of 19.3 nm was used as the metal microparticle material, and a metal microparticle mask layer was formed by coating of a toluene dispersion. The metal microparticle adjusting step, coating step, mask layer formation step, magnetic recording layer formation step, protective group removing step, adhesive gas exposure step, projection pattern transfer step, and magnetic recording layer formation step were the same as those of Example 1.

After that, a projection pattern was transferred to a layer to be processed in the same manner as in Example 1, thereby obtaining an Si projection pattern having a height of 5 nm. In addition, a magnetic recording medium was obtained by transferring the projection pattern via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 24

Example 24 is an example in which $Fe_3O_4$ having an average particle size of 20 nm was used as the metal microparticle material, and a metal microparticle mask layer was formed by coating of a toluene dispersion. The metal microparticle adjusting step, coating step, mask layer formation step, magnetic recording layer formation step, protective group removing step, adhesive gas exposure step, projection pattern transfer step, and magnetic recording layer formation step were the same as those of Example 1.

After that, a projection pattern was transferred to a layer to be processed in the same manner as in Example 1, thereby obtaining an Si projection pattern having a height of 5 nm. In addition, a magnetic recording medium was obtained by transferring the projection pattern via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 25

Example 25 is an example in which Co having an average particle size of 17.5 nm was used as the metal microparticle material, and a metal microparticle mask layer was formed by coating of a toluene dispersion. The metal microparticle adjusting step, coating step, mask layer formation step, magnetic recording layer formation step, protective group removing step, adhesive gas exposure step, projection pattern transfer step, and magnetic recording layer formation step were the same as those of Example 1.

After that, a projection pattern was transferred to a layer to be processed in the same manner as in Example 1, thereby obtaining an Si projection pattern having a height of 5 nm. In addition, a magnetic recording medium was obtained by transferring the projection pattern via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 26

Example 26 is an example in which Ni having an average particle size of 15.5 nm was used as the metal microparticle material, and a metal microparticle mask layer was formed by coating of a toluene dispersion. The metal microparticle adjusting step, coating step, mask layer formation step, magnetic recording layer formation step, protective group removing step, adhesive gas exposure step, projection pattern transfer step, and magnetic recording layer formation step were the same as those of Example 1.

After that, a projection pattern was transferred to a layer to be processed in the same manner as in Example 1, thereby obtaining an Si projection pattern having a height of 5 nm. In addition, a magnetic recording medium was obtained by transferring the projection pattern via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 27

Example 27 is an example in which Cu having an average particle size of 6.8 nm was used as the metal microparticle material, and a metal microparticle mask layer was formed by coating of a toluene dispersion. The metal microparticle adjusting step, coating step, mask layer formation step, magnetic recording layer formation step, protective group removing step, adhesive gas exposure step, projection pattern transfer step, and magnetic recording layer formation step were the same as those of Example 1.

After that, a projection pattern was transferred to a layer to be processed in the same manner as in Example 1, thereby obtaining an Si projection pattern having a height of 5 nm. In addition, a magnetic recording medium was obtained by transferring the projection pattern via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 28

Example 28 is an example in which Zn having an average particle size of 17.4 nm was used as the metal microparticle material, and a metal microparticle mask layer was formed by coating of a toluene dispersion. The metal microparticle adjusting step, coating step, mask layer formation step, magnetic recording layer formation step, protective group removing step, adhesive gas exposure step, projection pattern transfer step, and magnetic recording layer formation step were the same as those of Example 1.

After that, a projection pattern was transferred to a layer to be processed in the same manner as in Example 1, thereby obtaining an Si projection pattern having a height of 5 nm. In addition, a magnetic recording medium was obtained by transferring the projection pattern via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 29

Example 29 is an example in which Zr having an average particle size of 15.3 nm was used as the metal microparticle material, and a metal microparticle mask layer was formed by coating of a toluene dispersion. The metal microparticle adjusting step, coating step, mask layer formation step, magnetic recording layer formation step, protective group removing step, adhesive gas exposure step, projection pattern transfer step, and magnetic recording layer formation step were the same as those of Example 1.

After that, a projection pattern was transferred to a layer to be processed in the same manner as in Example 1, thereby obtaining an Si projection pattern having a height of 5 nm. In addition, a magnetic recording medium was obtained by transferring the projection pattern via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 30

Example 30 is an example in which No having an average particle size of 12.7 nm was used as the metal microparticle material, and a metal microparticle mask layer was formed by coating of a toluene dispersion. The metal microparticle adjusting step, coating step, mask layer formation step, magnetic recording layer formation step, protective group removing step, adhesive gas exposure step, projection pattern transfer step, and magnetic recording layer formation step were the same as those of Example 1.

After that, a projection pattern was transferred to a layer to be processed in the same manner as in Example 1, thereby obtaining an Si projection pattern having a height of 5 nm. In addition, a magnetic recording medium was obtained by transferring the projection pattern via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 31

Example 31 is an example in which Ru having an average particle size of 19.9 nm was used as the metal microparticle material, and a metal microparticle mask layer was formed by coating of a toluene dispersion. The metal microparticle adjusting step, coating step, mask layer formation step, magnetic recording layer formation step, protective group removing step, adhesive gas exposure step, projection pattern transfer step, and magnetic recording layer formation step were the same as those of Example 1.

After that, a projection pattern was transferred to a layer to be processed in the same manner as in Example 1, thereby obtaining an Si projection pattern having a height of 5 nm. In addition, a magnetic recording medium was obtained by transferring the projection pattern via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 32

Example 32 is an example in which PdSi having an average particle size of 18.9 nm was used as the metal microparticle material, and a metal microparticle mask layer was formed by coating of a toluene dispersion. The metal microparticle adjusting step, coating step, mask layer formation step, magnetic recording layer formation step, protective group removing step, adhesive gas exposure step, projection pattern transfer step, and magnetic recording layer formation step were the same as those of Example 1.

After that, a projection pattern was transferred to a layer to be processed in the same manner as in Example 1, thereby obtaining an Si projection pattern having a height of 5 nm. In addition, a magnetic recording medium was obtained by transferring the projection pattern via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 33

Example 33 is an example in which Ag having an average particle size of 9.7 nm was used as the metal microparticle material, and a metal microparticle mask layer was formed by coating of a toluene dispersion. The metal microparticle adjusting step, coating step, mask layer formation step, magnetic recording layer formation step, protective group removing step, adhesive gas exposure step, projection pattern transfer step, and magnetic recording layer formation step were the same as those of Example 1.

After that, a projection pattern was transferred to a layer to be processed in the same manner as in Example 1, thereby obtaining an Si projection pattern having a height of 5 nm. In addition, a magnetic recording medium was obtained by transferring the projection pattern via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 34

Example 34 is an example in which Ta having an average particle size of 15.3 nm was used as the metal microparticle material, and a metal microparticle mask layer was formed by coating of a toluene dispersion. The metal microparticle adjusting step, coating step, mask layer formation step, magnetic recording layer formation step, protective group removing step, adhesive gas exposure step, projection pattern transfer step, and magnetic recording layer formation step were the same as those of Example 1.

After that, a projection pattern was transferred to a layer to be processed in the same manner as in Example 1, thereby obtaining an Si projection pattern having a height of 5 nm. In addition, a magnetic recording medium was obtained by transferring the projection pattern via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 35

Example 35 is an example in which W having an average particle size of 10.8 nm was used as the metal microparticle material, and a metal microparticle mask layer was formed by coating of a toluene dispersion. The metal microparticle adjusting step, coating step, mask layer formation step, magnetic recording layer formation step, protective group removing step, adhesive gas exposure step, projection pattern transfer step, and magnetic recording layer formation step were the same as those of Example 1.

After that, a projection pattern was transferred to a layer to be processed in the same manner as in Example 1, thereby obtaining an Si projection pattern having a height of 5 nm. In addition, a magnetic recording medium was obtained by transferring the projection pattern via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 36

Example 36 is an example in which Pt having an average particle size of 18 nm was used as the metal microparticle material, and a metal microparticle mask layer was formed by coating of a toluene dispersion. The metal microparticle adjusting step, coating step, mask layer formation step, magnetic recording layer formation step, protective group removing step, adhesive gas exposure step, projection pattern transfer step, and magnetic recording layer formation step were the same as those of Example 1.

After that, a projection pattern was transferred to a layer to be processed in the same manner as in Example 1, thereby obtaining an Si projection pattern having a height of 5 nm. In addition, a magnetic recording medium was obtained by transferring the projection pattern via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 37

Example 37 is an example in which Ce having an average particle size of 19.9 nm was used as the metal microparticle material, and a metal microparticle mask layer was formed by coating of a toluene dispersion. The metal microparticle adjusting step, coating step, mask layer formation step, magnetic recording layer formation step, protective group removing step, adhesive gas exposure step, projection pattern transfer step, and magnetic recording layer formation step were the same as those of Example 1.

After that, a projection pattern was transferred to a layer to be processed in the same manner as in Example 1, thereby obtaining an Si projection pattern having a height of 5 nm. In addition, a magnetic recording medium was obtained by transferring the projection pattern via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 38

Examples 38 and 39 are examples in which wet etching was used in the metal microparticle layer protective group amount reducing step and second etching step. Table 3 (to be presented later) shows the type and average particle size of the metal microparticles, the first etching conditions, the gas exposure conditions, the second etching conditions, and the glide evaluation results.

Example 38 is the same as Example 1 except that propylene glycol monomethyl acetate (to be referred to as PGMEA hereinafter) was used in the first etching as the metal microparticle layer protective group removing step.

In the first etching, the sample was dipped in a PGMEA solvent for 10 sec and pulled up, and the sample surface was dried by $N_2$ direct blow. Thus, the protective group amount around the metal microparticles was reduced.

After that, a projection pattern was transferred to a layer to be processed in the same manner as in Example 1, thereby obtaining an Si projection pattern having a height of 5 nm. In addition, a magnetic recording medium was obtained by transferring the projection pattern via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 39

Example 39 is an example in which in the second etching as the projection pattern transfer step, an aqueous sodium hydroxide solution was used instead of $CHF_3$ dry etching, and AlBN was used as the layer to be processed. The metal microparticle adjusting step, coating step, mask layer formation step, magnetic recording layer formation step, protective group removing step, adhesive gas exposure step, projection pattern transfer step, and magnetic recording layer formation step were the same as those of Example 15.

In the second etching, a sodium hydroxide solution diluted to a weight percent concentration of 0.05% was used, and the sample was dipped in the solution for 13 sec and rinsed with pure water. Subsequently, the sample surface was dried by $N_2$ direct blow.

After that, a projection pattern was transferred to a layer to be processed in the same manner as in Example 15, thereby obtaining an AlBN projection pattern having a height of 5 nm.

In addition, a magnetic recording medium was obtained by transferring the projection pattern via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 40

Examples 40 to 43 are results obtained when the reduction amount of the protective group around the metal microparticles was changed by changing the first etching conditions. Table 3 (to be presented later) shows the type and average particle size of the metal microparticles, the first etching conditions, the gas exposure conditions, the second etching conditions, and the glide evaluation results.

Example 40 is a result obtained when the protective group amount of the metal microparticles was reduced by 70% from the initial state, and the metal microparticle adjusting step, coating step, mask layer formation step, magnetic recording layer formation step, protective group removing step, adhesive gas exposure step, projection pattern transfer step, and magnetic recording layer formation step were the same as those of Example 1.

In the first etching, dry etching was performed for 17 sec by using $O_2$ etchant and setting the antenna power at 30 W, the bias power at 2 W, the $O_2$ gas pressure at 20 sccm, and the gas pressure at 0.1 Pa. Consequently, it was possible to remove a protective group equivalent to 70% of the initial state.

After that, a projection pattern was transferred to a layer to be processed in the same manner as in Example 1, thereby obtaining an Si projection pattern having a height of 5 nm. In addition, a magnetic recording medium was obtained by transferring the projection pattern via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 41

Example 41 is a result obtained when the protective group amount of the metal microparticles was reduced by 50% from the initial state by changing the first etching conditions, and the metal microparticle adjusting step, coating step, mask layer formation step, magnetic recording layer formation step, protective group removing step, adhesive gas exposure step, projection pattern transfer step, and magnetic recording layer formation step were the same as those of Example 1.

In the first etching, dry etching was performed for 13 sec by using $O_2$ etchant and setting the antenna power at 30 W, the bias power at 0 W, the $O_2$ gas pressure at 20 sccm, and the gas pressure at 0.1 Pa. Consequently, it was possible to remove a protective group equivalent to 50% of the initial state.

After that, a projection pattern was transferred to a layer to be processed in the same manner as in Example 1, thereby obtaining an Si projection pattern having a height of 5 nm. In addition, a magnetic recording medium was obtained by transferring the projection pattern via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 42

Example 42 is a result obtained when the protective group amount of the metal microparticles was reduced by 40% from the initial state by changing the first etching conditions, and the metal microparticle adjusting step, coating step, mask layer formation step, magnetic recording layer formation step, protective group removing step, adhesive gas exposure step, projection pattern transfer step, and magnetic recording layer formation step were the same as those of Example 1.

In the first etching, dry etching was performed for 11 sec by using $O_2$ etchant and setting the antenna power at 30 W, the bias power at 0 W, the $O_2$ gas pressure at 20 sccm, and the gas pressure at 0.1 Pa. Consequently, it was possible to remove a protective group equivalent to 40% of the initial state.

After that, a projection pattern was transferred to a layer to be processed in the same manner as in Example 1, thereby obtaining an Si projection pattern having a height of 5 nm. In addition, a magnetic recording medium was obtained by transferring the projection pattern via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 43

Example 43 is a result obtained when the protective group amount of the metal microparticles was reduced by 30% from the initial state by changing the first etching conditions, and the metal microparticle adjusting step, coating step, mask layer formation step, magnetic recording layer formation step, protective group removing step, adhesive gas exposure step, projection pattern transfer step, and magnetic recording layer formation step were the same as those of Example 1.

In the first etching, dry etching was performed for 9 sec by using $O_2$ etchant and setting the antenna power at 25 W, the bias power at 0 W, the $O_2$ gas pressure at 20 sccm, and the gas pressure at 0.1 Pa. Consequently, it was possible to remove a protective group equivalent to 40% of the initial state.

After that, a projection pattern was transferred to a layer to be processed in the same manner as in Example 1, thereby obtaining an Si projection pattern having a height of 5 nm. In addition, a magnetic recording medium was obtained by transferring the projection pattern via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 44

Examples 44 to 47 are examples in which the projection pattern formation method and transfer method were variously changed. Table 3 (to be presented later) shows the type and average particle size of the metal microparticles, the first etching conditions, the gas exposure conditions, the second etching conditions, and the glide evaluation results.

This example is a method of performing patterning by forming a release layer between the magnetic recording layer and mask layer in the magnetic recording layer formation step. Steps except for a release layer formation step, a step of transferring a projection pattern from the mask layer to the release layer, and a step of removing the release layer from the magnetic recording layer were the same as those of Example 1.

After the magnetic recording layer was formed, a 2-nm thick AlBN release layer was deposited by DC sputtering at a gas flow rate of 20 sccm, a gas pressure of 0.1 Pa, and an input power of 500 W. Also, the projection pattern was transferred to the AlBN release layer by Ar ion milling in the same manner as in pattern transfer to the magnetic recording layer. Note that the Ar ion milling time was set to 75 sec.

Subsequently, after the projection pattern was transferred to the magnetic recording layer, the release layer was dissolved away by wet processing, thereby removing the mask layer from the magnetic recording layer. In the wet etching, an aqueous sodium hydroxide solution diluted to a weight percent concentration of 0.01% was used, and the sample was dipped in the solution for 150 sec and washed with pure water. Finally, the sample surface was dried by $N_2$ direct blow.

After that, a magnetic recording medium was obtained by forming a protective film on the magnetic recording layer in the same manner as in Example 1. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 45

Example 45 is an example in which the projection pattern of the metal microparticle layer was formed by nanoimprinting. In this example, a process of manufacturing a nanoimprinting stamper (to be referred to as a stamper hereinafter) from a metal microparticle mask layer formed on a layer to be processed and transferring a projection pattern by nanoimprinting to a nanoimprinting resist layer (to be referred to as a resist layer hereinafter) formed on the mask layer in the magnetic recording medium manufacturing process will be explained. The metal microparticle adjusting step, coating step, mask layer formation step, magnetic recording layer formation step, protective group removing step, adhesive gas exposure step, projection pattern transfer step, and magnetic recording layer formation step were the same as those of Example 1.

First, a master template for manufacturing a stamper was manufactured. A versatile 6-inch Si wafer was used as a substrate, and a 10-nm thick $SiO_2$ film was deposited by DC sputtering at a gas flow rate of 50 sccm, a gas pressure of 0.1 Pa, and an RF power of 150 W. After that, a metal microparticle projection pattern was transferred to the $SiO_2$ film by the method disclosed in Example 1.

Then, a stamper was manufactured by using the $SiO_2$ projection pattern. First, a conducting film was formed on the $SiO_2$ surface in order to perform electroforming on the obtained projection pattern. In this example, Ni was selected, and a 5-nm thick Ni conductive film was evenly formed by DC sputtering at an ultimate vacuum degree of $8.0 \times 10^{-4}$ Pa, an Ar gas pressure of 1.0 Pa, and an input power of 200 W. As the conductive film formation method, it is also possible to use vapor deposition or an Ni—P alloy or Ni—B alloy obtained by electroless plating, instead of sputtering.

Subsequently, an Ni electroformed layer was formed along the projection pattern by electroforming. As an electroforming solution, a high-concentration nickel sulfamate plating solution (NS-169) manufactured by Showa Chemical was used. A 300-µm thick Ni stamper was manufactured by using 600 g/L of nickel sulfamate, 40 g/L of boric acid, and 0.15 g/L of a sodium lauryl sulfate surfactant, at a liquid temperature of 55° C., a pH of 3.8 to 4.0, and a conduction current density of 20 A/dm$^2$, as the electroforming conditions. This stamper was released from the Si wafer, and oxygen ashing was performed to remove particles from the Ni projection pattern surface. In this ashing, an asher including a barrel type chamber was used, and the particles were removed from the recesses by performing ashing for 30 sec by setting the oxygen flow rate at 20 sccm and the input power at 200 W. Although not explained in this example, it is also possible to remove the resist material by wet removal by using an organic solvent or acid. Finally, the electroformed Ni plate was punched into a 2.5-inch disk shape, thereby obtaining a nanoimprinting Ni stamper.

In addition, a resin stamper was duplicated by performing an injection molding process on this Ni stamper. As the resin material, a cyclic olefin polymer (ZEONOR 1060R) available from ZEON was used.

A projection pattern was formed on a resist layer by using the resin stamper obtained as described above. First, a medium sample was spin-coated with a 10-nm thick ultraviolet-curing resist, thereby forming a resist layer. Subsequently, the resin stamper was imprinted on the resist layer, and the resist layer was cured by ultraviolet irradiation (ultraviolet light was radiated while the resin stamper was pressed against the ultraviolet-curing resin layer). A desired 8-nm dot pattern was obtained by releasing the resin stamper from the cured resist layer.

A resist residue formed by imprinting in the grooves of the projection pattern of the sample was removed by etching. This resist residue removal was performed by plasma etching using $O_2$ etchant. That is, the resist residue was removed by performing etching for 8 sec at an $O_2$ gas flow rate of 5 sccm, a pressure of 0.1 Pa, an input power of 100 W, and a bias power of 10 W. An 8-nm thick resist pattern was obtained by transferring the metal microparticle pattern to the Si transfer layer as described above.

After that, a projection pattern was transferred to a layer to be processed in the same manner as in Example 1, thereby obtaining an Si projection pattern having a height of 5 nm. In addition, a magnetic recording medium was obtained by transferring the projection pattern via a C mask layer. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 46

Example 46 is an example in which after a projection micropattern template was manufactured, a magnetic recording layer was selectively grown on the projection pattern. Example 46 is equivalent to a case in which the order of steps was changed in Example 2. Since the layer to be processed formation step, metal microparticle adjusting step, coating step, protective group removing step, adhesive gas exposure step, projection pattern transfer step, metal microparticle removing step, and magnetic recording layer formation step were performed in this order, the basic process contents were the same as those of Example 2.

After that, the projection pattern was transferred to a 5-nm thick Si layer to be processed and a magnetic recording layer was formed in accordance with the contents of Example 2, thereby manufacturing a magnetic recording medium having the projection pattern. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Example 47

Example 47 is an example in which a projection micropattern template was manufactured by nanoimprinting, and a magnetic recording medium was manufactured by using the template. The contents of the imprinting stamper manufacturing step and imprinting step were the same as those of Example 45, and the contents of the magnetic recording layer formation step using the projection micropattern template were the same as those of Example 46.

After that, a magnetic recording medium having the projection pattern was manufactured in accordance with the contents of the examples. A head floating amount with respect to the obtained magnetic recording medium was measured by a glide height tester, thereby evaluating the floating characteristic. Consequently, it was possible to pass a floating amount of 8 nm as a standard necessary to evaluate the read/write characteristic of the medium.

Comparative Example 1

Figure 16:
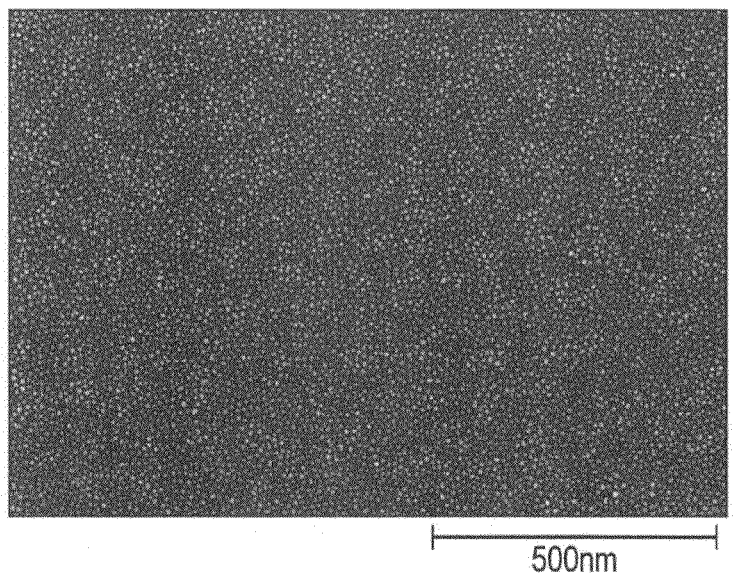
FIG. 16 is a photograph showing an upper-surface SEM image of a projection pattern after the metal microparticle mask according to the embodiment is removed.

Comparative Example 1 is an example in which the first etching step and adhesive gas exposure step were excluded from Example 1. The second etching was performed for an etching time of 12 sec by using $CHF_3$ gas as an etchant at an antenna power of 100 W, a bias power of 30 W, a gas flow rate of 20 sccm, and a gas pressure of 0.1 Pa. After a projection pattern was formed, the pattern was observed with an SEM. Consequently, pattern aggregation was found, as shown in FIG. 16, i.e., it was confirmed that the pitch variation worsened.

After that, a magnetic recording medium was manufactured by transferring the projection pattern to a magnetic recording layer via a C mask layer in accordance with the contents of Example 1. A head floating amount with respect to the obtained magnetic recording medium was measured by a glide height tester, thereby evaluating the floating characteristic. Consequently, many hits by the aggregated pattern on the medium surface were measured, and it was impossible to pass a floating amount of 8 nm as a standard necessary to evaluate the read/write characteristic of the medium.

Comparative Example 2

Comparative Example 2 is an example in which the first etching step and adhesive gas exposure step were excluded from Example 1, and is a result obtained when the second etching gas was changed to $O_2$. The metal microparticle adjusting step, coating step, mask layer formation step, magnetic recording layer formation step, protective group removing step, adhesive gas exposure step, projection pattern transfer step, and magnetic recording layer formation step were the same as those of Example 1. Note that as a mask readily transferable by $O_2$ etchant, 15-nm thick C was used as the mask layer material.

The second etching was performed for an etching time of 5 sec at an antenna power of 50 W, a bias power of 5 W, a gas flow rate of 20 sccm, and a gas pressure of 0.1 Pa. As a consequence, the microparticle pattern aggregated although the etching conditions were set to a low power and short time period, i.e., it was confirmed that the pitch variation worsened.

After that, a magnetic recording medium was manufactured by transferring the projection pattern to a magnetic recording layer via a C mask layer in accordance with the contents of Example 1. A head floating amount with respect to the obtained magnetic recording medium was measured by a glide height tester, thereby evaluating the floating characteristic. Consequently, many hits by the aggregated pattern on the medium surface were measured, and it was impossible to pass a floating amount of 8 nm as a standard necessary to evaluate the read/write characteristic of the medium.

Comparative Example 3

Comparative Example 3 is an example in which the adhesive gas exposure step was excluded from Example 1, and the metal microparticle adjusting step, coating step, mask layer formation step, magnetic recording layer formation step, protective group removing step, projection pattern transfer step, and magnetic recording layer formation step were the same as those of Example 1.

After that, a magnetic recording medium was manufactured by transferring the projection pattern to a magnetic recording layer via Si and C mask layers in accordance with the contents of Example 1. A head floating amount with respect to the obtained magnetic recording medium was measured by a glide height tester, thereby evaluating the floating characteristic. Consequently, many hits by the aggregated pattern on the medium surface were measured, and it was impossible to pass a floating amount of 8 nm as a standard necessary to evaluate the read/write characteristic of the medium.

Comparative Example 4

Comparative Example 4 is an example in which the first etching step was excluded from Example 1, and the metal microparticle adjusting step, coating step, mask layer formation step, magnetic recording layer formation step, protective group removing step, adhesive gas exposure step, projection pattern transfer step, and magnetic recording layer formation step were the same as those of Example 1.

After that, a magnetic recording medium was manufactured by transferring the projection pattern to a magnetic recording layer via Si and C mask layers in accordance with the contents of Example 1. A head floating amount with respect to the obtained magnetic recording medium was measured by a glide height tester, thereby evaluating the floating characteristic. Consequently, many hits by the aggregated pattern on the medium surface were measured, and it was impossible to pass a floating amount of 8 nm as a standard necessary to evaluate the read/write characteristic of the medium.

Comparative Example 5

Comparative Example 5 is a result obtained when the etchant to be used in the second etching step in Example 1 was changed to $O_2$, and the metal microparticle adjusting step, coating step, mask layer formation step, magnetic recording layer formation step, protective group removing step, adhesive gas exposure step, projection pattern transfer step, and magnetic recording layer formation step were the same as those of Example 1.

The second etching was performed for 5 sec at an antenna power of 50 W, a bias power of 5 W, a gas flow rate of 20 sccm, and a gas pressure of 0.1 Pa. As a consequence, the microparticle pattern aggregated although the etching conditions were set to a low power and short time period, i.e., it was confirmed that the pitch variation worsened. This tendency was the same as that of Comparative Example 2, and demonstrated that the microparticles easily aggregated by projection pattern transfer using a decomposable gas even when the adhesive gas exposure step was included.

After that, a magnetic recording medium was manufactured by transferring the projection pattern to a magnetic recording layer via a C mask layer in accordance with the contents of Example 1. A head floating amount with respect to the obtained magnetic recording medium was measured by a glide height tester, thereby evaluating the floating characteristic. Consequently, many hits by the aggregated pattern on the medium surface were measured, and it was impossible to pass a floating amount of 8 nm as a standard necessary to evaluate the read/write characteristic of the medium.

Comparative Example 6

Comparative Example 6 is an example in which $CHF_3$ was used as the etchant for use in the first etching step, adhesive gas exposure step, and second etching step, and the metal microparticle adjusting step, coating step, mask layer formation step, magnetic recording layer formation step, protective group removing step, adhesive gas exposure step, projection pattern transfer step, and magnetic recording layer formation step were the same as those of Example 1.

An attempt was made to reduce the protective group amount by performing the first etching for an etching time of 15 sec at an antenna power of 50 W, a bias power of 0 W, a gas flow rate of 40 sccm, and a gas pressure of 0.1 Pa. When the pattern upper surface was observed with an SEM after the first etching, the adhesive gas component filled the spacings between the microparticles in the protective group removing step, so the boundary of the microparticle layer was unclear.

After that, a magnetic recording medium was manufactured by transferring the projection pattern to a magnetic recording layer via a C mask layer in accordance with the contents of Example 1. A head floating amount with respect to the obtained magnetic recording medium was measured by a glide height tester, thereby evaluating the floating characteristic. Consequently, projection pattern transfer was insufficient as well as many hits by the aggregated pattern on the medium surface were measured, and it was impossible to pass a floating amount of 8 nm as a standard necessary to evaluate the read/write characteristic of the medium.

Comparative Example 7

Comparative Examples 7 to 9 are examples in which the gas flow rate in the adhesive gas exposure step in Example 1 was changed.

In Comparative Example 7, the gas flow rate was set at 5 sccm. The metal microparticle adjusting step, coating step, mask layer formation step, magnetic recording layer formation step, protective group removing step, adhesive gas exposure step, projection pattern transfer step, and magnetic recording layer formation step were the same as those of Example 1. When the projection pattern was observed with an SEM after the second etching, the substitution of the protective group by the adhesive gas was insufficient, and the microparticle pattern aggregated.

After that, a magnetic recording medium was manufactured by transferring the projection pattern to a magnetic recording layer via a C mask layer in accordance with the contents of Example 1. A head floating amount with respect to the obtained magnetic recording medium was measured by a glide height tester, thereby evaluating the floating characteristic. Consequently, many hits by the aggregated pattern on the medium surface were measured, and it was impossible to pass a floating amount of 8 nm as a standard necessary to evaluate the read/write characteristic of the medium.

Comparative Example 8

Comparative Example 8 is the same as Comparative Example 7 except that the gas flow rate in the adhesive gas exposure step was set at 70 sccm.

When the projection pattern was observed with an SEM after the second etching, the projection pattern spacings were filled due to excessive exposure to the adhesive gas.

After that, a magnetic recording medium was manufactured by transferring the projection pattern to a magnetic recording layer via a C mask layer in accordance with the contents of Example 1. A head floating amount with respect to the obtained magnetic recording medium was measured by a glide height tester, thereby evaluating the floating characteristic. Consequently, projection pattern transfer was insufficient as well as many hits by the aggregated pattern on the medium surface were measured, and it was impossible to pass a floating amount of 8 nm as a standard necessary to evaluate the read/write characteristic of the medium.

Comparative Example 9

Comparative Example 9 is the same as Comparative Example 7 except that the gas flow rate in the adhesive gas exposure step was set at 80 sccm.

When the projection pattern was observed with an SEM after the second etching, the projection pattern spacings were filled due to excessive exposure to the adhesive gas.

After that, a magnetic recording medium was manufactured by transferring the projection pattern to a magnetic recording layer via a C mask layer in accordance with the contents of Example 1. A head floating amount with respect to the obtained magnetic recording medium was measured by a glide height tester, thereby evaluating the floating characteristic. Consequently, projection pattern transfer was insufficient as well as many hits by the aggregated pattern on the medium surface were measured, and it was impossible to pass a floating amount of 8 nm as a standard necessary to evaluate the read/write characteristic of the medium.

Comparative Example 10

Comparative Example 10 is an example in which the etchant used in the first etching step, adhesive gas exposure step, and second etching step was $O_2$, and the metal microparticle adjusting step, coating step, mask layer formation step, magnetic recording layer formation step, projection pattern transfer step, and magnetic recording layer formation step were the same as those of Example 1.

The second etching was performed under the same conditions as in Comparative Example 2. When the obtained pattern was observed with an SEM, no effect of the adhesive gas was found and the microparticle pattern aggregated as in Comparative Example 2.

After that, a magnetic recording medium was manufactured by transferring the projection pattern to a magnetic recording layer via a C mask layer in accordance with the contents of Example 1. A head floating amount with respect to the obtained magnetic recording medium was measured by a glide height tester, thereby evaluating the floating characteristic. Consequently, many hits by the aggregated pattern on the medium surface were measured, and it was impossible to pass a floating amount of 8 nm as a standard necessary to evaluate the read/write characteristic of the medium.

Comparative Example 11

Comparative Examples 11 to 15 are examples in which the protective group amount to be removed was changed by changing the first etching conditions in Example 1. Comparative Example 11 is an example in which the protective group amount was reduced by 90% from the initial state, and the metal microparticle adjusting step, coating step, mask layer formation step, magnetic recording layer formation step, projection pattern transfer step, and magnetic recording layer formation step were the same as in Example 1.

In the first etching, dry etching was performed for an etching time of 10 sec by using $O_2$ etchant and setting the antenna power at 50 W, the bias power at 4 W, the $O_2$ gas pressure at 20 sccm, and the gas pressure at 0.1 Pa. Consequently, it was possible to remove a protective group equivalent to 90% of the initial state. When the projection pattern was observed, with an SEM after the first etching, the microparticle pattern already aggregated, and the pitch variation worsened.

After that, a magnetic recording medium was manufactured by transferring the projection pattern to a magnetic recording layer via a C mask layer in accordance with the contents of Example 1. A head floating amount with respect to the obtained magnetic recording medium was measured by a glide height tester, thereby evaluating the floating characteristic. Consequently, many hits by the aggregated pattern on the medium surface were measured, and it was impossible to pass a floating amount of 8 nm as a standard necessary to evaluate the read/write characteristic of the medium.

Comparative Example 12

Comparative Example 12 is the same as Comparative Example 11 except that the protective group amount was reduced by 80% by the first etching.

In the first etching, dry etching was performed for an etching time of 8 sec by using $O_2$ etchant and setting the antenna power at 50 W, the bias power at 4 W, the $O_2$ gas pressure at 20 sccm, and the gas pressure at 0.1 Pa. Consequently, it was possible to remove a protective group equivalent to 90% of the initial state. When the projection pattern was observed with an SEM after the first etching, the microparticle pattern already aggregated, and the pitch variation worsened.

After that, a magnetic recording medium was manufactured by transferring the projection pattern to a magnetic recording layer via a C mask layer in accordance with the contents of Example 1. A head floating amount with respect to the obtained magnetic recording medium was measured by a glide height tester, thereby evaluating the floating characteristic. Consequently, many hits by the aggregated pattern on the medium surface were measured, and it was impossible to pass a floating amount of 8 nm as a standard necessary to evaluate the read/write characteristic of the medium.

Comparative Example 13

Comparative Example 13 is the same as Comparative Example 11 except that the protective group amount was reduced by 25% by the first etching.

In the first etching, dry etching was performed for an etching time of 7 sec by using $O_2$ etchant and setting the antenna power at 25 W, the bias power at 0 W, the $O_2$ gas pressure at 20 sccm, and the gas pressure at 0.1 Pa. Consequently, it was possible to remove a protective group equivalent to 25% of the initial state. When the projection pattern was observed with an SEM after the second etching, the substitution of the protective group was insufficient, so the microparticle pattern aggregated, and the pitch variation worsened.

After that, a magnetic recording medium was manufactured by transferring the projection pattern to a magnetic recording layer via a C mask layer in accordance with the contents of Example 1. A head floating amount with respect to the obtained magnetic recording medium was measured by a glide height tester, thereby evaluating the floating characteristic. Consequently, many hits by the aggregated pattern on the medium surface were measured, and it was impossible to pass a floating amount of 8 nm as a standard necessary to evaluate the read/write characteristic of the medium.

Comparative Example 14

Comparative Example 14 is the same as Comparative Example 11 except that the protective group amount was reduced by 20% by the first etching.

In the first etching, dry etching was performed for an etching time of 9 sec by using $O_2$ etchant and setting the antenna power at 20 W, the bias power at 0 W, the $O_2$ gas pressure at 20 sccm, and the gas pressure at 0.1 Pa. Consequently, it was possible to remove a protective group equivalent to 20% of the initial state. When the projection pattern was observed with an SEM after the second etching, the substitution of the protective group was insufficient, so the microparticle pattern aggregated, and the pitch variation worsened.

After that, a magnetic recording medium was manufactured by transferring the projection pattern to a magnetic recording layer via a C mask layer in accordance with the contents of Example 1. A head floating amount with respect to the obtained magnetic recording medium was measured by a glide height tester, thereby evaluating the floating characteristic. Consequently, many hits by the aggregated pattern on the medium surface were measured, and it was impossible to pass a floating amount of 8 nm as a standard necessary to evaluate the read/write characteristic of the medium.

Comparative Example 15

Comparative Example 15 is the same as Comparative Example 11 except that the protective group amount was reduced by 10% by the first etching.

In the first etching, dry etching was performed for an etching time of 5 sec by using $O_2$ etchant and setting the antenna power at 20 W, the bias power at 0 W, the $O_2$ gas pressure at 20 sccm, and the gas pressure at 0.1 Pa. Consequently, it was possible to remove a protective group equivalent to 10% of the initial state. When the projection pattern was observed with an SEM after the second etching, the substitution of the protective group was insufficient, so the microparticle pattern aggregated, and the pitch variation worsened.

After that, a magnetic recording medium was manufactured by transferring the projection pattern to a magnetic recording layer via a C mask layer in accordance with the contents of Example 1. A head floating amount with respect to the obtained magnetic recording medium was measured by a glide height tester, thereby evaluating the floating characteristic. Consequently, many hits by the aggregated pattern on the medium surface were measured, and it was impossible to pass a floating amount of 8 nm as a standard necessary to evaluate the read/write characteristic of the medium.

For comparative examples 1 to 15, Table 4 (to be presented later) shows the type and average particle size of the metal microparticles, the first etching conditions, the gas exposure conditions, the second etching conditions, and the glide evaluation results.

TABLE 1

| Example | Metal microparticles | Average particle size [nm] | First etching | Gas exposure | Second etching | Glide evaluation result |
|---|---|---|---|---|---|---|
| 1 | Au | 8 | $O_2$ dry | $CHF_3$ | $CHF_3$ dry | 8 nm floating OK |
| 2 | Au | 8 | $O_2$ dry | $CHF_3$ | $CHF_3$ dry | 8 nm floating OK |
| 3 | Au | 8 | $O_2$ dry | $CHF_3$ flow rate was changed | $CHF_3$ dry | 8 nm floating OK |
| 4 | Au | 8 | $O_2$ dry | $CHF_3$ flow rate was changed | $CHF_3$ dry | 8 nm floating OK |
| 5 | Au | 8 | $O_2$ dry | $CHF_3$ flow rate was changed | $CHF_3$ dry | 8 nm floating OK |
| 6 | Au | 8 | $O_2$ dry | $CHF_3$ flow rate was changed | $CHF_3$ dry | 8 nm floating OK |
| 7 | Au | 8 | $O_2$ dry | $CHF_3$ flow rate was changed | $CHF_3$ dry | 8 nm floating OK |
| 8 | Au | 8 | $O_2$ dry | $CHF_3$ | $CF_4$ dry | 8 nm floating OK |
| 9 | Au | 8 | $O_2$ dry | $CHF_3$ | $C_4F_8$ dry | 8 nm floating OK |
| 10 | Au | 8 | $O_2$ dry | $CHF_3$ | $CH_3F$ dry | 8 nm floating OK |
| 11 | Au | 8 | $O_2$ dry | $CF_4$ | $CHF_3$ dry | 8 nm floating OK |
| 12 | Au | 8 | $O_2$ dry | $C_4F_8$ | $CHF_3$ dry | 8 nm floating OK |
| 13 | Au | 8 | $O_2$ dry | $CHF_3$ | $CHF_3$ dry | 8 nm floating OK |
| 14 | Au | 8 | $O_2$ dry | $CHF_3$ | Ar dry | 8 nm floating OK |
| 15 | Au | 8 | $O_2$ dry | $CHF_3$ | $C_{12}$ dry | 8 nm floating OK |
| 16 | Au | 8 | $O_2$ dry | $CHF_3$ | $BC_{13}$ dry | 8 nm floating OK |
| 17 | Au | 8 | $O_2$ dry | $CHF_3$ | $SF_6$ dry | 8 nm floating OK |
| 18 | Au | 8 | $O_2$ dry | $CHF_3$ | $CHF_3$ + Ar dry | 8 nm floating OK |
| 19 | Au | 8 | $O_2$ dry | $CHF_3$ | $CHF_3$ + $O_2$ dry | 8 nm floating OK |

TABLE 2

| Example | Metal microparticles | Average particle size [nm] | First etching | Gas exposure | Second etching | Glide evaluation result |
|---|---|---|---|---|---|---|
| 20 | C | 8.2 | $O_2$ dry | $CHF_3$ | $CHF_3$ dry | 8 nm floating OK |
| 21 | Al | 15.3 | $O_2$ dry | $CHF_3$ | $CHF_3$ dry | 8 nm floating OK |
| 22 | Si | 19.8 | $O_2$ dry | $CHF_3$ | $CHF_3$ dry | 8 nm floating OK |
| 23 | Ti | 19.3 | $O_2$ dry | $CHF_3$ | $CHF_3$ dry | 8 nm floating OK |
| 24 | $Fe_2O_3$ | 20 | $O_2$ dry | $CHF_3$ | $CHF_3$ dry | 8 nm floating OK |
| 25 | Co | 17.5 | $O_2$ dry | $CHF_3$ | $CHF_3$ dry | 8 nm floating OK |
| 26 | Ni | 15.5 | $O_2$ dry | $CHF_3$ | $CHF_3$ dry | 8 nm floating OK |
| 27 | Cu | 6.8 | $O_2$ dry | $CHF_3$ | $CHF_3$ dry | 8 nm floating OK |
| 28 | Zn | 17.4 | $O_2$ dry | $CHF_3$ | $CHF_3$ dry | 8 nm floating OK |
| 29 | Zr | 15.3 | $O_2$ dry | $CHF_3$ | $CHF_3$ dry | 8 nm floating OK |
| 30 | Mo | 12.7 | $O_2$ dry | $CHF_3$ | $CHF_3$ dry | 8 nm floating OK |
| 31 | Ru | 19.9 | $O_2$ dry | $CHF_3$ | $CHF_3$ dry | 8 nm floating OK |
| 32 | PdSi | 18.9 | $O_2$ dry | $CHF_3$ | $CHF_3$ dry | 8 nm floating OK |
| 33 | Ag | 9.7 | $O_2$ dry | $CHF_3$ | $CHF_3$ dry | 8 nm floating OK |
| 34 | Ta | 15.3 | $O_2$ dry | $CHF_3$ | $CHF_3$ dry | 8 nm floating OK |
| 35 | W | 10.8 | $O_2$ dry | $CHF_3$ | $CHF_3$ dry | 8 nm floating OK |
| 36 | Pt | 18 | $O_2$ dry | $CHF_3$ | $CHF_3$ dry | 8 nm floating OK |
| 37 | Ce | 19.9 | $O_2$ dry | $CHF_3$ | $CHF_3$ dry | 8 nm floating OK |

TABLE 3

| Example | Metal microparticles | Average particle size [nm] | First etching | Gss exposure | Second etching | Glide evaluation result |
|---|---|---|---|---|---|---|
| 38 | Au | 8 | PGMEA wet | $CHF_3$ | $CHF_3$ dry | 8 nm floating OK |
| 39 | Au | 8 | $O_2$ dry | $CHF_3$ | NaOH wet | 8 nm floating OK |
| 40 | Au | 8 | $O_2$ removal amount was changed | $CHF_3$ | $CHF_3$ dry | 8 nm floating OK |
| 41 | Au | 8 | $O_2$ removal amount was changed | $CHF_3$ | $CHF_3$ dry | 8 nm floating OK |
| 42 | Au | 8 | $O_2$ removal amount was changed | $CHF_3$ | $CHF_3$ dry | 8 nm floating OK |
| 43 | Au | 8 | $O_2$ removal amount was changed | $CHF_3$ | $CHF_3$ dry | 8 nm floating OK |
| 44 | Au | 8 | $O_2$ dry | $CHF_3$ | $CHF_3$ dry | 8 nm floating OK |
| 45 | Au | 8 | $O_2$ dry | $CHF_3$ | $CHF_3$ dry | 8 nm floating OK |
| 46 | Au | 8 | $O_2$ dry | $CHF_3$ | $CHF_3$ dry | 8 nm floating OK |
| 47 | Au | 8 | $O_2$ dry | $CHF_3$ | $CHF_3$ dry | 8 nm floating OK |

TABLE 4

| Comparative Example | Metal microparticles | Average particle size [nm] | First etching | Gas exposure | Second etching | Glide evaluation result |
|---|---|---|---|---|---|---|
| 1 | Au | 8 | — | — | $CHF_3$ | 8 nm floating NG |
| 2 | Au | 8 | — | — | $O_2$ | 8 nm floating NG |
| 3 | Au | 8 | $O_2$ | — | $CHF_3$ | 8 nm floating NG |
| 4 | Au | 8 | — | $CHF_3$ | $CHF_3$ | 8 nm floating NG |
| 5 | Au | 8 | O2 | $CHF_3$ | $O_2$ | 8 nm floating NG |
| 6 | Au | 8 | $CHF_3$ | $CHF_3$ | $CHF_3$ | 8 nm floating NG |
| 7 | Au | 8 | $O_2$ | $CHF_3$ flow rate was changed | $CHF_3$ | 8 nm floating NG |
| 8 | Au | 8 | $O_2$ | $CHF_3$ flow rate was changed | $CHF_3$ | 8 nm floating NG |
| 9 | Au | 8 | $O_2$ | $CHF_3$ flow rate was changed | $CHF_3$ | 8 nm floating NG |
| 10 | Au | 8 | $O_2$ | $O_2$ | $O_2$ | 8 nm floating NG |
| 11 | Au | 8 | $O_2$ removal amount was changed | $CHF_3$ | $CHF_3$ | 8 nm floating NG |
| 12 | Au | 8 | $O_2$ removal amount was changed | $CHF_3$ | $CHF_3$ | 8 nm floating NG |
| 13 | Au | 8 | $O_2$ removal amount was changed | $CHF_3$ | $CHF_3$ | 8 nm floating NG |
| 14 | Au | 8 | $O_2$ removal amount was changed | $CHF_3$ | $CHF_3$ | 8 nm floating NG |
| 15 | Au | 8 | $O_2$ removal amount was changed | $CHF_3$ | $CHF_3$ | 8 nm floating NG |

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern formation method, comprising:
   forming a layer to be processed on a substrate;
   forming a metal microparticle layer by coating the layer to be processed with a metal microparticle coating solution comprising metal microparticles and a solvent;
   reducing a protective group amount around the metal microparticles by first etching;
   after the reducing the protective group, exposing the substrate and the metal microparticles to a gas comprising carbon and fluorine to form a protective layer, to adsorb the gas around the metal microparticles to substitute the gas for the protective group, and to obtain a projection pattern; and
   transferring the projection pattern to the layer to be processed by second etching.

2. The method according to claim 1, further comprising removing the metal microparticles after the transferring the projection pattern to the layer to be processed.

3. A stamper manufacturing method, comprising:
   forming a layer to be processed on a substrate;
   forming a metal microparticle layer by coating the layer to be processed with a metal microparticle coating solution comprising metal microparticles and a solvent;
   reducing a protective group amount around the metal microparticles by first etching;
   after the reducing the protective group, exposing the substrate and the metal microparticles to a gas comprising carbon and fluorine to form a protective layer, to adsorb the gas around the metal microparticles to substitute the gas for the protective group, and to obtain a projection pattern;
   transferring the projection pattern to the layer to be processed by second etching;
   forming a conductive layer on the projection pattern;
   forming an electroformed layer by performing electroplating on the conductive layer; and
   releasing the electroformed layer from the layer to be processed.

4. The method according to claim 3, further comprising removing the metal microparticles before the forming the conductive layer on the projection pattern.

5. A magnetic recording medium manufacturing method, comprising:
   forming a magnetic recording layer on a substrate;
   forming a metal microparticle layer by coating the magnetic recording layer with a metal microparticle coating solution comprising metal microparticles and a solvent;
   reducing a protective group amount around the metal microparticles by first etching;
   after the reducing the protective group, exposing the substrate and the metal microparticles to a gas comprising carbon and fluorine to form a protective layer, to adsorb the gas around the metal microparticles to substitute the gas for the protective group, and to obtain a projection pattern; and
   transferring the projection pattern to the magnetic recording layer by second etching.

6. The method according to claim 5, further comprising forming a release layer on the magnetic recording layer before the forming the metal microparticle layer, and dissolving away the release layer and removing the metal microparticle layer after the transferring the projection pattern to the magnetic recording layer.

7. A magnetic recording medium manufacturing method, comprising:
   forming an underlayer on a substrate;
   forming a metal microparticle layer by coating the underlayer with a metal microparticle coating solution comprising metal microparticles and a solvent;

reducing a protective group amount around the metal microparticles by first etching;

after the reducing the protective group, exposing the substrate and the metal microparticles to a gas comprising carbon and fluorine to form a protective layer, to adsorb the gas around the metal microparticles to substitute the gas for the protective group, and to obtain a projection pattern;

transferring the projection pattern to the underlayer by second etching;

removing the metal microparticles from the underlayer; and forming a magnetic recording layer on the underlayer having the projection pattern.

8. A magnetic recording medium manufacturing method, comprising:

forming a layer to be processed on a substrate;

forming a metal microparticle layer by coating the layer to be processed with a metal microparticle coating solution comprising metal microparticles and a solvent;

reducing a protective group amount around the metal microparticles by first etching;

after the reducing the protective group, exposing the substrate and the metal microparticles to a gas comprising carbon and fluorine to form a protective layer, and to adsorb the gas around the metal microparticles to substitute the gas for the protective group;

transferring a projection pattern to the layer to be processed by second etching;

forming a conductive layer on the projection pattern;

forming an electroformed layer by performing electroplating on the conductive layer;

releasing the electroformed layer from the layer to be processed to form a stamper;

forming a magnetic recording layer on a substrate;

forming a resist layer on the magnetic recording layer;

forming a projection pattern by imprinting the stamper on the resist layer; and transferring the projection pattern to the magnetic recording layer.

9. A magnetic recording medium manufacturing method, comprising:

forming a layer to be processed on a substrate;

forming a metal microparticle layer by coating the layer to be processed with a metal microparticle coating solution comprising metal microparticles and a solvent;

reducing a protective group amount around the metal microparticles by first etching;

after the reducing the protective group, exposing the substrate to a gas comprising carbon and fluorine to form a protective layer, to adsorb the gas around the metal microparticles to substitute the gas for the protective group, and to obtain a projection pattern;

transferring the projection pattern to the layer to be processed by second etching;

forming a conductive layer on the projection pattern;

forming an electroformed layer by performing electroplating on the conductive layer;

releasing the electroformed layer from the layer to be processed to form a stamper;

forming a magnetic recording layer on a substrate;

forming an underlayer on the magnetic recording layer;

forming a resist layer on the underlayer;

forming a projection pattern by imprinting the stamper on the resist layer;

transferring the projection pattern to the underlayer; and forming a magnetic recording layer on the underlayer having the projection pattern.

* * * * *